(12) United States Patent
Choi et al.

(10) Patent No.: US 12,408,524 B2
(45) Date of Patent: Sep. 2, 2025

(54) DISPLAY DEVICE

(71) Applicant: SAMSUNG DISPLAY CO., LTD., Yongin-si (KR)

(72) Inventors: Keunhee Choi, Yongin-si (KR); Jisun Kim, Yongin-si (KR); Youngwan Seo, Yongin-si (KR); Kyunghoe Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 435 days.

(21) Appl. No.: 17/988,172

(22) Filed: Nov. 16, 2022

(65) Prior Publication Data
US 2023/0284489 A1 Sep. 7, 2023

(30) Foreign Application Priority Data
Mar. 3, 2022 (KR) .................. 10-2022-0027644

(51) Int. Cl.
*H10K 59/131* (2023.01)
*G09G 3/32* (2016.01)

(52) U.S. Cl.
CPC .................................. *H10K 59/131* (2023.02)

(58) Field of Classification Search
CPC ................. H10K 59/131; H10K 77/10; G09G 2300/0426; G09G 2300/0814; G09G 2300/0819; G09G 3/03; G09G 3/3233; H10D 86/421; H10D 86/423; H10D 86/443; H10D 86/60
See application file for complete search history.

(56) References Cited

U.S. PATENT DOCUMENTS

| 9,252,388 B2 | 2/2016 | Jang et al. |
| 10,229,964 B2 | 3/2019 | Kim et al. |
| 10,939,547 B2 | 3/2021 | Lee et al. |
| 2014/0132148 A1* | 5/2014 | Jang .................. H10K 50/8426 313/504 |
| 2018/0240856 A1* | 8/2018 | Kim ..................... H10K 59/121 |

(Continued)

FOREIGN PATENT DOCUMENTS

| CN | 112133733 A | 12/2020 |
| CN | 112201680 A | 1/2021 |

(Continued)

*Primary Examiner* — Pegeman Karimi
(74) *Attorney, Agent, or Firm* — CANTOR COLBURN LLP

(57) ABSTRACT

A display device includes: a substrate including a central area, a corner area including an extension area extending in a direction away from the central area, and an intermediate area between the central area and the corner area; a first wiring line disposed in the intermediate area; a second-first wiring line extending along one of opposite edges of the extension area, a second-second wiring line extending along the other one of the opposite edges of the extension area, a first-first connection wiring line, which electrically connects the second-first wiring line and the second-second wiring line to the first wiring line, a plurality of second connection wiring lines connecting the second-first wiring line to the second-second wiring line in the extension area, and a third connection wiring line connecting the plurality of second connection wiring lines to each other in the extension area.

26 Claims, 19 Drawing Sheets

(56) References Cited

U.S. PATENT DOCUMENTS

| | | | |
|---|---|---|---|
| 2019/0347989 A1* | 11/2019 | Lee | H10K 77/111 |
| 2021/0118976 A1 | 4/2021 | Zhao et al. | |
| 2021/0158758 A1 | 5/2021 | Kim | |
| 2021/0376038 A1* | 12/2021 | Won | H10K 59/1213 |
| 2022/0102462 A1 | 3/2022 | Zhou et al. | |

FOREIGN PATENT DOCUMENTS

| | | |
|---|---|---|
| KR | 101420332 B1 | 7/2014 |
| KR | 1020180096875 A | 8/2018 |
| KR | 20190053585 A | 5/2019 |
| KR | 1020190102123 A | 9/2019 |
| KR | 1020210062770 A | 6/2021 |
| KR | 1020210149279 A | 12/2021 |

* cited by examiner

DISPLAY DEVICE

This application claims priority to Korean Patent Application No. 10-2022-0027644, filed on Mar. 3, 2022, and all the benefits accruing therefrom under 35 U.S.C. § 119, the content of which in its entirety is herein incorporated by reference.

BACKGROUND

1. Field

One or more embodiments relate to a display device, and more particularly, to a display device capable of displaying a high-quality image.

2. Description of the Related Art

In general, a display device includes a plurality of pixels, each of which includes a display element and a pixel circuit for controlling the display element. The pixel circuit includes a thin-film transistor ("TFT") and a storage capacitor.

Such a display device may be an electronic device. In addition, a display device with a structure in which a portion of a display unit is bent has been developed.

SUMMARY

However, in the case of a partially bent display device, there is a problem in that large stress is generated in a display panel and a high-quality image may not be displayed.

In order to solve various problems including the above problem, one or more embodiments include a display device capable of displaying a high-quality image. However, it should be understood that the embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to one or more embodiments, a display device includes: a substrate including a central area, a corner area including an extension area extending in a direction away from the central area, and an intermediate area between the central area and the corner area, where the direction away from the central area is an extension direction of the extension area; a first wiring line disposed in the intermediate area; a second-first wiring line extending along one of opposite edges of the extension area extending in the extension direction, a second-second wiring line extending along another of the opposite edges of the extension area extending in the extension direction; a first-first connection wiring line, which electrically connects the second-first wiring line and the second-second wiring line to the first wiring line; a plurality of second connection wiring lines connecting the second-first wiring line to the second-second wiring line in the extension area; and a third connection wiring line connecting the plurality of second connection wiring lines to each other in the extension area.

The second-first wiring line, the second-second wiring line, and the plurality of second connection wiring lines may be integrally formed as one body.

The display device may further include a fourth connection wiring line connecting an end of the second-first wiring line in a direction toward the first wiring line to an end of the second-second wiring line in the direction toward the first wiring line, wherein the first-first connection wiring line may be connected to the fourth connection wiring line.

The second-first wiring line, the second-second wiring line, the plurality of second connection wiring lines, and the fourth connection wiring line may be integrally formed as one body.

The first wiring line may be disposed on a first insulating layer, which covers the second-first wiring line, the second-second wiring line, and the plurality of second connection wiring lines.

The third connection wiring line may be disposed on the first insulating layer.

The first-first connection wiring line may be disposed on a second insulating layer covering the first wiring line.

The plurality of second connection wiring lines may extend in a direction crossing the extension direction of the extension area.

The third connection wiring line may extend in the extension direction of the extension area.

The display device may further include a pixel circuit disposed in the extension area and including a driving transistor, wherein the first wiring line may be configured to transmit a driving voltage to be applied to the driving transistor.

The substrate may further include a first area adjacent to the central area in a first direction, and a second area adjacent to the central area in a second direction crossing the first direction, wherein the intermediate area and the corner area may surround at least a part of the first area, the central area, and the second area.

The substrate may be bent in the corner area, the first area, and the second area.

According to one or more embodiments, a display device includes: a substrate including a central area, a corner area including an extension area extending in a direction away from the central area, and an intermediate area between the central area and the corner area, where the direction away from the central area is an extension direction of the extension area; a first wiring line disposed in the intermediate area; a plurality of second wiring lines disposed in the intermediate area so as to be located between the first wiring line and the extension area, the plurality of second wiring lines being connected to the first wiring line and extending from the first wiring line in an extension direction of the extension area and the extension direction of the extension area being the same as the direction away from the central area; and a plurality of additional wiring lines connecting the plurality of second wiring lines to each other.

The first wiring line may be disposed on a first insulating layer covering the plurality of second wiring lines.

The plurality of additional wiring lines may be disposed on the first insulating layer.

The plurality of additional wiring lines may extend in a direction crossing the extension direction.

The display device may further include a pixel circuit disposed in the intermediate area so as to be between the first wiring line and the extension area and including a driving transistor, wherein the first wiring line may be configured to transmit a driving voltage to be applied to the driving transistor.

The display device may further include a display element disposed in the intermediate area and located farther from the first wiring line than the pixel circuit, the display element being electrically connected to the pixel circuit.

The substrate may further include a first area adjacent to the central area in a first direction, and a second area adjacent to the central area in a second direction crossing the first direction, wherein the intermediate area and the corner area may surround at least a part of the first area, the central area, and the second area.

The substrate may be bent in the corner area, the first area, and the second area.

The first wiring line may extend along an outside of the first area, wherein the first wiring line in the intermediate area may have a width-varying portion outside the first area.

An edge of the first wiring line in the direction away from the central area may have a stepped portion forming the width-varying portion.

The extension area may be provided in plurality, and a separation area may be defined between the extension areas adjacent to each other.

The substrate may be bent in the corner area.

Other aspects, features, and advantages than the above-described aspects, features, and advantages will be apparent from a detailed description, the claims, and the drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
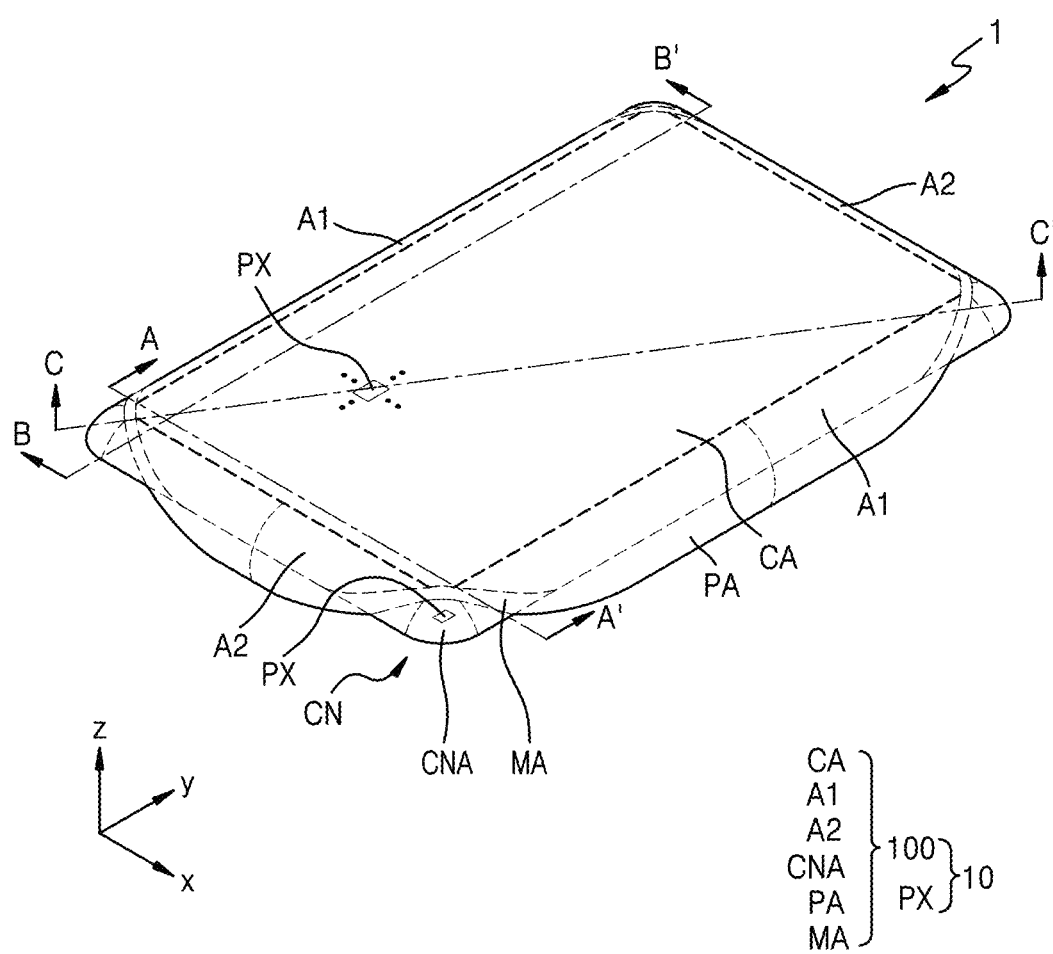
FIG. 1 is a schematic perspective view illustrating a portion of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since the disclosure may have diverse modified embodiments, preferred embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence are rendered the same reference numeral regardless of the figure number, and redundant explanations are omitted.

It will be understood that when a layer, region, or component is referred to as being "formed on," another layer, region, or component, it can be directly or indirectly formed on the other layer, region, or component. That is, for example, intervening layers, regions, or components may be present. Sizes of elements in the drawings may be exaggerated for convenience of explanation. For example, since sizes and thicknesses of components in the drawings are arbitrarily illustrated for convenience of explanation, the following embodiments are not limited thereto.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

In the following embodiments, the X-axis, the Y-axis and the Z-axis are not limited to three axes of the rectangular coordinate system, and may be interpreted in a broader sense. For example, the X-axis, the Y-axis, and the Z-axis may be perpendicular to one another, or may represent different directions that are not perpendicular to one another.

Figure 2A:
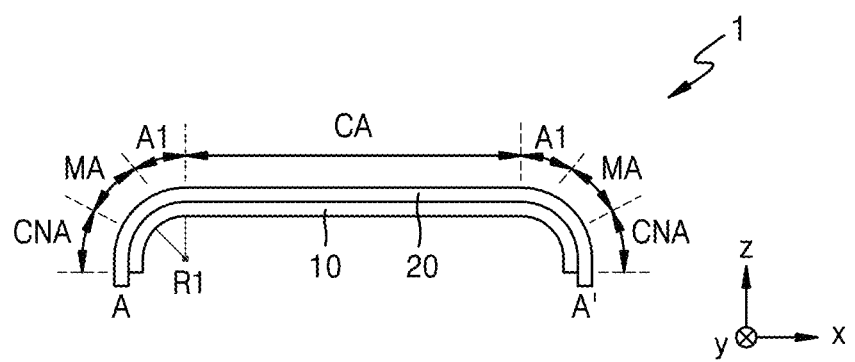
FIG. 2A is a schematic cross-sectional view illustrating a cross-section of the display device taken along line A-A' in FIG. 1.
Figure 2B:
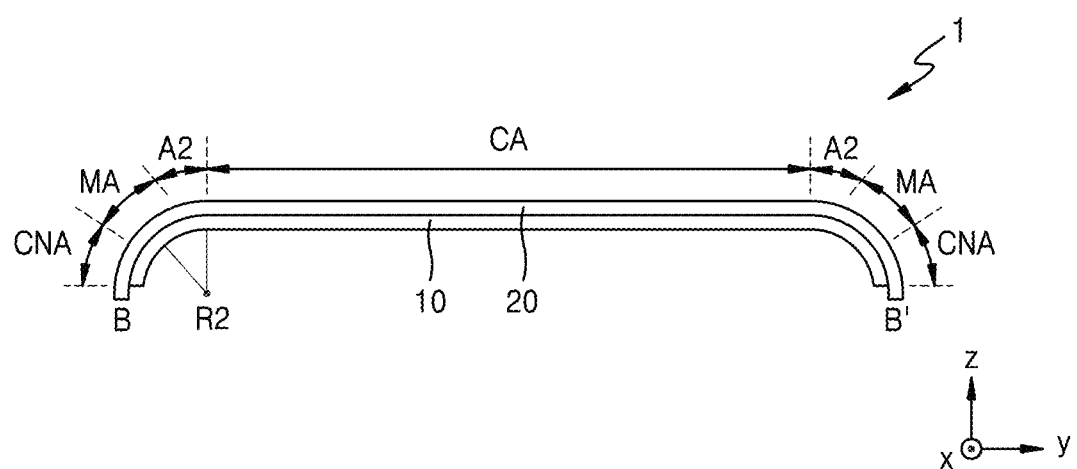
FIG. 2B is a schematic cross-sectional view illustrating a cross-section of the display device taken along line B-B' in FIG. 1.
Figure 2C:
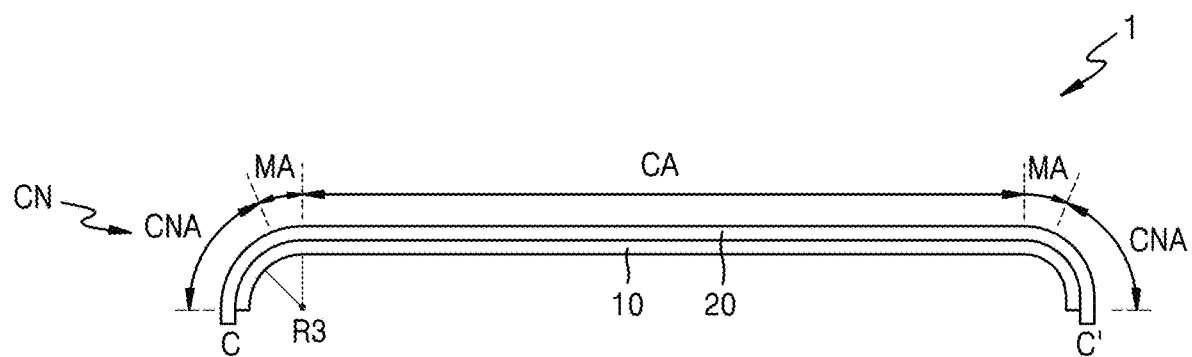
FIG. 2C is a schematic cross-sectional view illustrating a cross-section of the display device taken along line C-C' in FIG. 1.

FIG. 1 is a schematic perspective view illustrating a portion of a display device 1 according to an embodiment, FIG. 2A is a schematic cross-sectional view illustrating a cross-section of the display device 1 taken along line A-A' in FIG. 1, FIG. 2B is a schematic cross-sectional view illustrating a cross-section of the display device taken along line B-B' in FIG. 1, and FIG. 2C is a schematic cross-sectional view illustrating a cross-section of the display device 1 taken along line C-C' in FIG. 1.

The display device 1 may be a device, which displays a moving image or still image, and may be a portable electronic device, such as a mobile phone, a smart phone, a tablet personal computer ("PC"), a mobile communication terminal, an electronic notebook, an e-book, a portable multimedia player ("PMP"), a navigation device, or an ultra mobile PC ("UMPC"). The display device 1 may be an electronic device, such as a television, a laptop computer, a monitor, a billboard, or an Internet of Things ("IOT") device. Alternatively, the display device 1 may be a wearable device, such as a smart watch, a watch phone, a glasses-display, or a head mounted display ("HMD"). Alternatively, the display device 1 may be a portion of another device. For example, the display device 1 may be a display unit of any electronic device. Alternatively, the display device 1 may be a gauge of a vehicle or a center information display ("CID") disposed on a center fascia or dashboard of a vehicle, may be a room mirror display replacing a side mirror of a vehicle, or may be a display unit disposed on a rear surface of a front seat as entertainment for a rear seat of a vehicle.

Referring to FIGS. 1 and 2A to 2C, the display device 1 capable of displaying an image may have an edge extending in a first direction and an edge extending in a second direction. In this case, the first direction and the second direction may be directions crossing each other. For example, an angle formed by the first direction and the second direction may be an acute angle. Alternatively, the angle formed by the first direction and the second direction may be an obtuse angle or a right angle. Hereinafter, for convenience, a case in which the first direction and the second direction are perpendicular to each other will be mainly described. For example, the first direction may be an x direction or a -x direction, and the second direction may be a y direction or a -y direction.

A corner CN where the edge extending in the first direction (the x direction or the -x direction) meets the edge extending in the second direction (the y direction or the -y direction) may have a certain curvature.

The display device 1 may include a cover window 20 and a display panel 10. The cover window 20 may protect the display panel 10. In an embodiment, the cover window 20 may be disposed on the display panel 10. In an embodiment, the cover window 20 may be a flexible window. The cover window 20 may be easily bent by an external force to protect the display panel 10. In another embodiment, the cover window 20 may include glass, sapphire, or plastic. The cover window 20 may include ultra-thin glass. Alternatively, the cover window 20 may include colorless polyimide.

The display panel 10 may be disposed under the cover window 20. The display panel 10 may be attached to the cover window 20 by, for example, an optically clear adhesive ("OCA") (not shown).

The display panel 10 may display an image. The display panel 10 may include a substrate 100 and a pixel PX. The display panel 10 may include a central area CA, a first area A1, a second area A2, a corner area CNA, an intermediate area MA, and a peripheral area PA. For example, the substrate 100 in the display panel 10 may include the central area CA, the first area A1, the second area A2, the corner area CNA, the intermediate area MA, and the peripheral area PA. That is, the central area CA, the first area A1, the second area A2, the corner area CNA, the intermediate area MA, and the peripheral area PA may be defined in the substrate 100.

The central area CA may be a flat area. The display device 1 may provide most of the images in the central area CA.

The first area A1 may be adjacent to the central area CA in the first direction (e.g., the x direction or the -x direction). The first area A1 may extend in the second direction (e.g., the y-direction or the -y-direction). The display panel 10 may be bent in the first area A1. That is, the first area A1 may be a curved area, unlike the central area CA, in a cross-section (e.g., a zx cross-section) in the first direction. On the other hand, the first area A1 may appear not to be bent in a cross-section (e.g., a yz cross-section) in the second direction. That is, the first area A1 may be a curved area about an axis extending in the second direction. As used herein, the "zx cross-section" means a cross-section cut by a plan defined by the z direction and the x direction, and the "yz cross-section" means a cross-section cut by a plan defined by the z direction and the y direction.

Although FIG. 2A illustrates an example in which the first area A1 located in the x direction from the central area CA and the first area A1 located in the -x direction from the central area CA have the same curvature, the disclosure is not limited thereto. In another embodiment, for example, the first area A1 located in the x direction from the central area CA and the first area A1 located in the -x direction from the central area CA may have different curvatures.

The second area A2 may be adjacent to the central area CA in the second direction. The second area A2 may extend in the first direction. The display panel 10 may be bent in the second area A2. That is, the second area A2 may be defined as a curved area, unlike the central area CA, in a cross-section (e.g., the yz cross-section) in the second direction. On the other hand, the second area A2 may appear not to be bent in a cross-section (e.g., the zx cross-section) in the first direction. That is, the second area A2 may be a curved area about an axis extending in the first direction.

Although 2B illustrates an example in which the second area A2 located in the y direction from the central area CA and the second area A2 located in the -y direction from the central area CA have the same curvature, the disclosure is not limited thereto. In another embodiment, for example, the second area A2 located in the y direction from the central area CA and the second area A2 located in the -y direction from the central area CA may have different curvatures.

The display panel 10 may be bent in the corner area CNA. The corner area CNA may be an area disposed at a corner CN. That is, the corner area CNA may be an area where an edge of the display device 1 in the first direction meets an edge of the display device 1 in the second direction. The corner area CNA may surround at least a part of the central area CA, the first area A1, and the second area A2. Alternatively, the corner area CNA may surround at least a part of the central area CA, the first area A1, the second area A2, and the intermediate area MA.

As described above, when the first area A1 extends in the second direction and is bent in a cross-section (e.g., the zx cross-section) in the first direction and the second area A2 extends in the first direction and is bent in a cross-section (e.g., the yz cross-section) in the second direction, at least a portion of the corner area CNA may appear to be bent in both a cross-section (e.g., the zx cross-section) in the first direction and a cross-section (e.g., the yz cross-section) in the second direction. That is, at least a portion of the corner area CNA may be a curved area having a plurality of curvatures in a plurality of directions. The display device 1 may have a plurality of corner areas CNA.

The intermediate area MA may be located between the central area CA and the corner area CNA. The intermediate area MA may extend between the first area A1 and the corner area CNA in a direction in which the first area A1 extends. The intermediate area MA may extend between the second area A2 and the corner area CNA in a direction in which the second area A2 extends. The intermediate area MA may be bent. In addition, a driving circuit for providing an electrical signal to the pixel PX may be disposed in the intermediate area MA, and a power supply line for providing power to the pixel PX may be disposed in the intermediate area MA. In an embodiment, the pixel PX disposed in the intermediate area MA may overlap the driving circuit and/or the power supply line in a plan view.

The peripheral area PA may be located outside the central area CA. Specifically, the peripheral area PA may be located outside the first area A1 and the second area A2. The pixel PX may not be disposed in the peripheral area PA. That is, the peripheral area PA may be a non-display area that does not display an image. A driving circuit for providing an electrical signal to the pixel PX may be disposed in the peripheral area PA, or a power supply line for providing power to the pixel PX may be disposed in the peripheral area PA.

As shown in FIG. 2A, a portion of the corner area CNA, the intermediate area MA, and the first area A1 may be bent by a first radius of curvature R1. As shown in FIG. 2B, another portion of the corner area CNA, the intermediate area MA, and the second area A2 may be bent by a second radius of curvature R2. As shown in FIG. 2C, another portion of the corner area CNA and the intermediate area MA may be bent by a third radius of curvature R3.

The pixel PX may be disposed on the substrate 100. In an embodiment, the pixel PX may be implemented as a display element DPE (see FIGS. 4 and 7). A plurality of pixels PX may be provided, and each of the pixels PX may include a red sub-pixel, a green sub-pixel, and a blue sub-pixel. Alternatively, each of the pixels PX may include a red sub-pixel, a green sub-pixel, a blue sub-pixel, and a white sub-pixel.

The pixel PX may be disposed in at least one of the central area CA, the first area A1, the second area A2, and the corner area CNA. For example, the plurality of pixels PX may be arranged in the central area CA, the first area A1, the second area A2, the corner area CNA, and the intermediate area MA. Accordingly, the display device 1 may display an image in the central area CA, the first area A1, the second area A2, the corner area CNA, and the intermediate area MA. In an embodiment, the display device 1 may provide an independent image in each of the central area CA, the first area A1, the second area A2, the corner area CNA, and the intermediate area MA. Alternatively, the display device 1 may provide a portion of any one image in each of the central area CA, the first area A1, the second area A2, the corner area CNA, and the intermediate area MA.

As such, the display device 1 may display an image not only in the central area CA but also in the first area A1, the second area A2, the intermediate area MA, and the corner area CNA. Accordingly, an area occupied by a display area, which is an area for displaying an image in the display device 1, may be remarkably increased. In addition, because the display device 1 may display an image even at the bent corner CN, an aesthetic sense may be improved.

Figure 3:
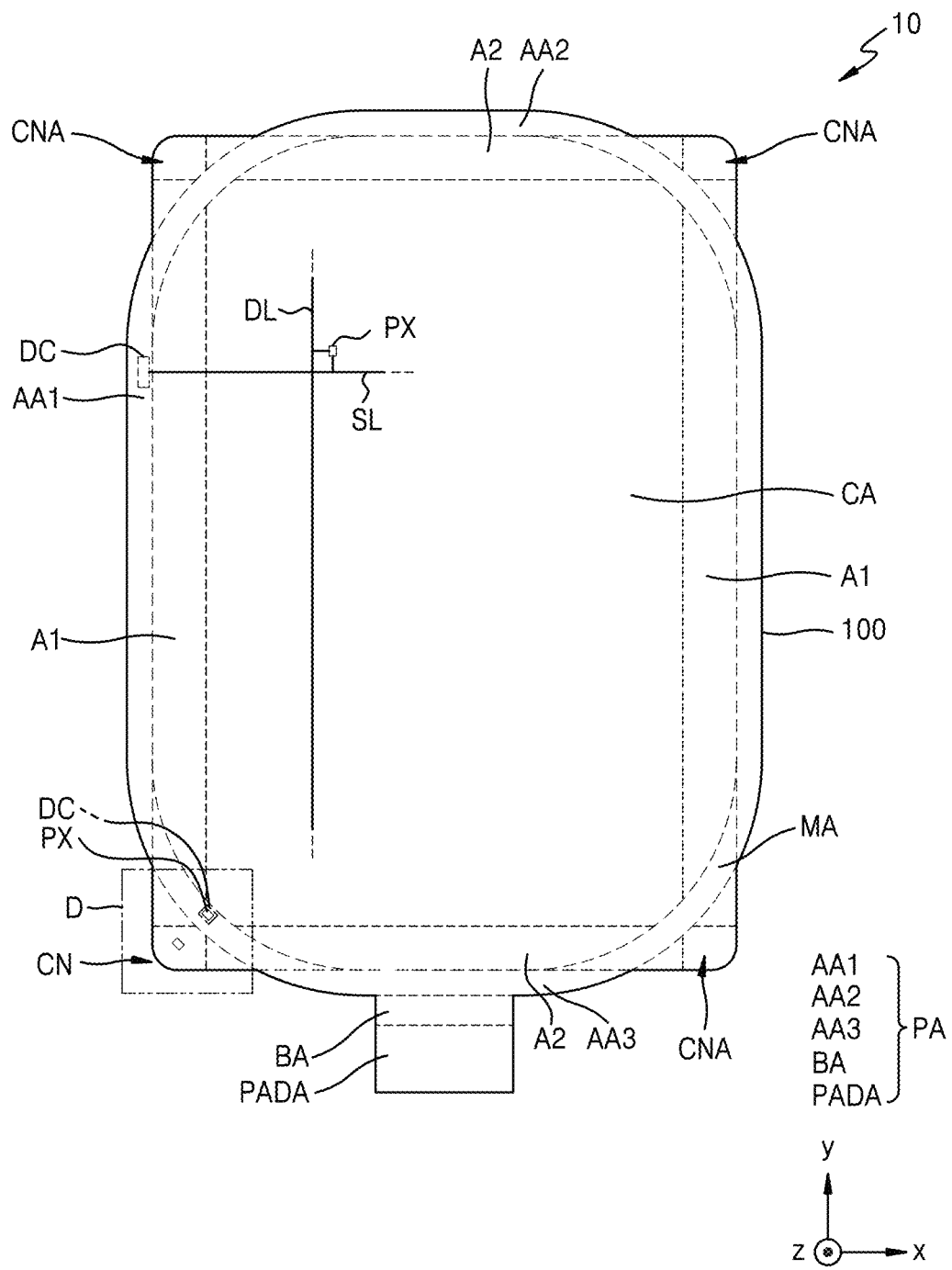
FIG. 3 is a schematic plan view illustrating a display panel that is a portion of the display device of FIG. 1.

FIG. 3 is a schematic plan view illustrating the display panel 10 that is a portion of the display device 1 of FIG. 1. FIG. 3 schematically illustrates a state in which the display panel 10 is unfolded without being bent.

As described above, the peripheral area PA may be disposed outside the central area CA. The peripheral area PA may include a first adjacent area AA1, a second adjacent area AA2, a third adjacent area AA3, a bending area BA, and a pad area PADA.

The first adjacent area AA1 may be located outside the first area A1. That is, the first area A1 may be located between the first adjacent area AA1 and the central area CA. Accordingly, the first adjacent area AA1 may be located in the first direction from the first area A1, and may extend in the second direction like the first area A1. A driving circuit DC and/or a power supply line may be disposed in the first adjacent area AA1.

The second adjacent area AA2 and the third adjacent area AA3 may be located outside the second area A2. That is, the second area A2 may be located between the second adjacent area AA2 and the central area CA and between the third adjacent area AA3 and the central area CA. The second adjacent area AA2 and the third adjacent area AA3 may extend in the first direction like the second area A2. The second area A2 and the central area CA may be located between the second adjacent area AA2 and the third adjacent area AA3.

The bending area BA may be located outside the third adjacent area AA3. That is, the third adjacent area AA3 may be located between the bending area BA and the second area A2. In addition, the pad area PADA may be disposed outside the bending area BA. That is, the bending area BA may be located between the third adjacent area AA3 and the pad area PADA. The display panel 10 may be bent in the bending area BA. In this case, the pad area PADA may overlap other portions of the display panel 10 in a plan view. Accordingly, the area of the peripheral area PA visible to a user may be reduced. A pad (not shown) may be disposed in the pad area PADA. The display panel 10 may receive an electrical signal and/or a power voltage through the pad.

Although FIG. 3 illustrates an example in which the display panel 10 is in an unfolded state without being bent, the display panel 10 may be bent in a portion thereof as described above. That is, at least one of the first area A1, the second area A2, the corner area CNA, and the intermediate area MA may be bent.

Specifically, the first area A1 may be bent about an axis extending in the second direction, and thus may appear to be bent in a cross-section (e.g., the zx cross-section) in the first direction and to be not bent in a cross-section (e.g., the yz cross-section) in the second direction. The second area A2 may be bent about an axis extending in the first direction, and thus may appear to be bent in a cross-section (e.g., the yz cross-section) in the second direction and to be not bent in a cross-section (e.g., the zx cross-section) in the first direction. As at least a portion of the corner area CNA is bent in both a cross-section (e.g., the zx cross-section) in the first direction and a cross-section (e.g., the yz cross-section) in the second direction, at least a portion of the corner area CNA may be a curved area having a plurality of curvatures in a plurality of directions.

When the corner area CNA is bent in this way, a compressive strain occurring in the corner area CNA may be greater than a tensile strain occurring in the corner area CNA. Therefore, a structure such as a contractible substrate 100 is desirable to be applied to at least a portion of the corner area CNA. As a result, the structure of the display panel 10 in the corner area CNA may be different from the structure of the display panel 10 in the central area CA.

The pixel PX that may be disposed in at least one of the central area CA, the first area A1, the second area A2, the corner area CNA, and the intermediate area MA may include a display element. The display element may be an organic light-emitting diode including an organic emission layer. Alternatively, the display element may be a light-emitting diode including an inorganic emission layer. The light-emitting diode may have a micro scale size or a nano scale size. For example, the light-emitting diode may be a micro light-emitting diode. Alternatively, the light-emitting diode may be a nanorod light-emitting diode. The nanorod light-emitting diode may include gallium nitride (GaN). In an embodiment, a color conversion layer may be disposed on the display element. In this case, the color conversion layer may include quantum dots. Alternatively, the display element may be a quantum dot light-emitting diode including a quantum dot emission layer. Hereinafter, a case in which the display element includes an organic light-emitting diode will be described for convenience.

The pixel PX may include a plurality of sub-pixels, and each of the plurality of sub-pixels may emit light of a certain color by using the display element. The sub-pixel is the smallest unit that implements an image, and refers to an emission area. When an organic light-emitting diode is used as the display element, the emission area may be defined by an opening of a pixel-defining layer. This aspect will be described below.

The driving circuit DC may provide a signal to each of the pixels PX. For example, the driving circuit DC may be a scan driving circuit that provides a scan signal, through a scan line SL, to pixel circuits electrically connected to sub-pixels in the pixel PX. Alternatively, the driving circuit DC may be an emission control driving circuit that provides an emission control signal, through an emission control line (not shown), to the pixel circuits electrically connected to the sub-pixels. Alternatively, the driving circuit DC may be a data driving circuit that provides a data signal, through a data line DL, to the pixel circuits electrically connected to the sub-pixels. Although not shown in the drawings, the data driving circuit may be disposed in the third adjacent area AA3 or the pad area PADA. Alternatively, the data driving circuit may be disposed on a display circuit board connected through a pad.

Figure 4:
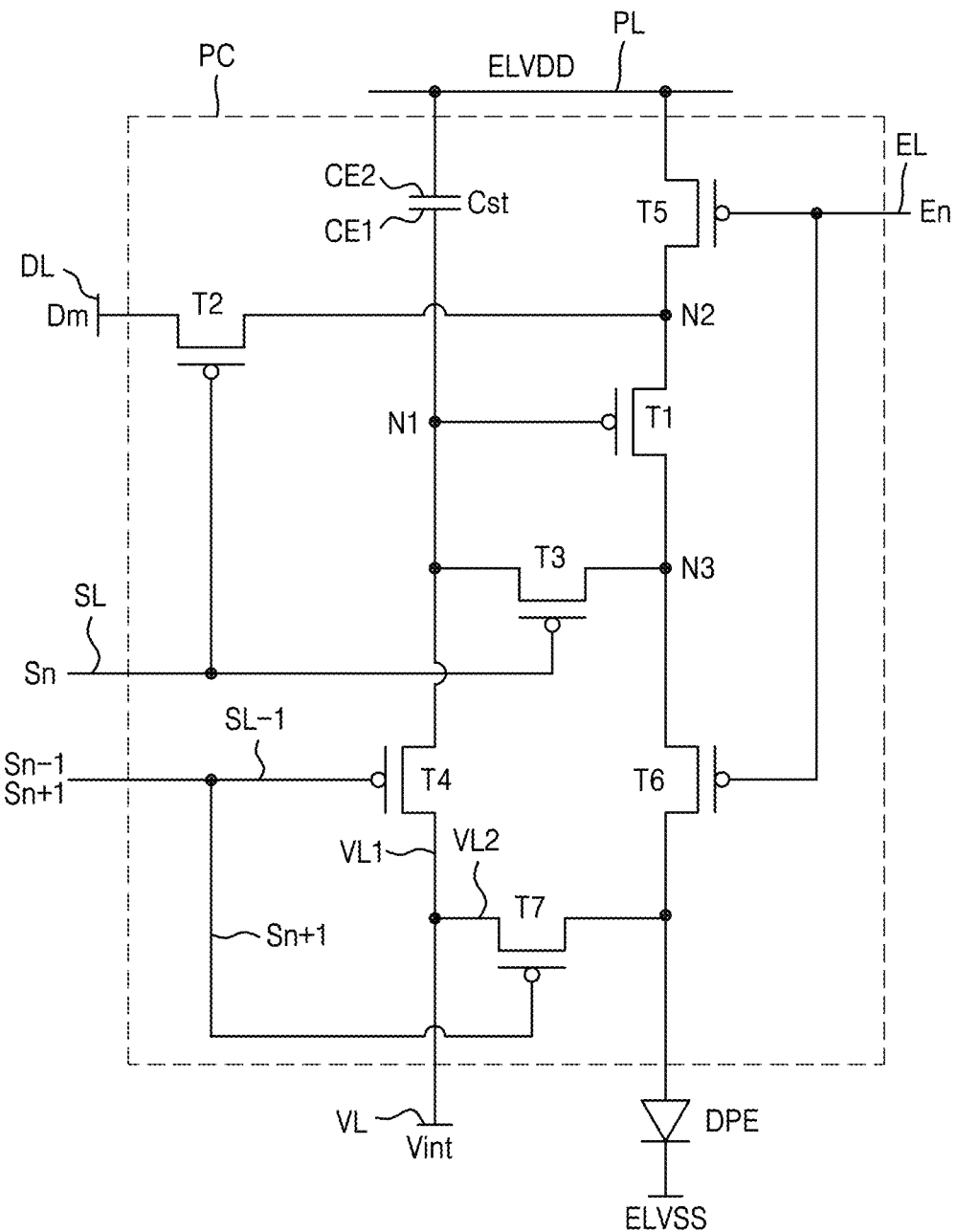
FIG. 4 is an equivalent circuit diagram illustrating an example of a pixel circuit in the display device of FIG. 1.

FIG. 4 is an equivalent circuit diagram illustrating an example of a pixel circuit PC in the display device 1 of FIG. 1. That is, FIG. 4 is an equivalent circuit diagram of a pixel circuit PC electrically connected to an organic light-emitting diode that is a display element DPE forming a sub-pixel included in the display device 1 of FIG. 1. The pixel circuit PC electrically connected to one sub-pixel may include a plurality of thin-film transistors T1 to T7 and a storage capacitor Cst. The thin-film transistors T1 to T7 and the storage capacitor Cst may be connected to signal lines SL, SL−1, SL+1, EL, and DL, a first initialization voltage line VL1, a second initialization voltage line VL2, and a power supply voltage line PL. The thin-film transistors T1 to T7 may include the driving thin-film transistor T1, switching thin-film transistor T2, the compensation thin-film transistor T3, the first initialization thin-film transistor T4, the operation control thin-film transistor T5, the emission control thin film transistor T6, and the second initialization thin-film transistor T7.

The signal lines SL, SL−1, SL+1, EL, and DL may include a scan line SL configured to transmit a scan signal Sn, a previous scan line SL−1 configured to transmit a previous scan signal Sn−1 to a first initialization thin-film transistor T4, a subsequent scan line SL+1 configured to transmit the scan signal Sn+1 to a second initialization thin-film transistor T7, an emission control line EL configured to transmit an emission control signal En to an operation control thin-film transistor T5 and an emission control thin-film transistor T6, and a data line DL configured to cross the scan line SL and transmit a data signal Dm. The power supply voltage line PL connected to the first wiring line WL1 (See FIG. 11) may be configured to transmit a driving voltage ELVDD to a driving thin-film transistor T1, the first initialization voltage line VL1 may be configured to transmit an initialization voltage Vint to the first initialization thin-film transistor T4, and the second initialization voltage line VL2 may be configured to transmit the initialization voltage Vint to the second initialization thin-film transistor T7.

A driving gate electrode G1 (i.e., a first gate electrode) (see FIG. 5) of the driving thin-film transistor T1 that is a first transistor may be connected to a lower electrode CE1 of the storage capacitor Cst, a driving source region S1 (see FIG. 5) of the driving thin-film transistor T1 may be connected to the power supply voltage line PL via the operation control thin-film transistor T5, and a driving drain region D1 (see FIG. 5) of the driving thin-film transistor T1 may be electrically connected to a pixel electrode of the organic light-emitting diode, which is the display element DPE, via the emission control thin-film transistor T6. That is, the driving thin-film transistor T1 may be configured to control the amount of current flowing from a second node N2 connected to the power supply voltage line PL to the organic light-emitting diode, that is, the display element DPE, in response to a voltage applied to a first node N1, that is, a voltage applied to the driving gate electrode G1. Accordingly, the driving thin-film transistor T1 may receive the data signal Dm according to a switching operation of a switching thin-film transistor T2 and supply a driving current to the organic light-emitting diode, that is, the display element DPE. The operation control thin-film transistor T5 may be connected between the second node N2 and the power supply voltage line PL.

A switching gate electrode G2 (i.e., a second gate electrode) (see FIG. 5) of the switching thin-film transistor T2 that is a second transistor may be connected to the scan line SL, a switching source region S2 (see FIG. 5) of the switching thin-film transistor T2 may be connected to the data line DL, and a switching drain region D2 (see FIG. 5) of the switching thin-film transistor T2 may be connected to the second node N2 and the driving source region S1 of the driving thin-film transistor T1 and may be connected to the power supply voltage line PL via the operation control thin-film transistor T5. The switching thin-film transistor T2 may be configured to be turned on according to the scan signal Sn received through the scan line SL and perform a switching operation of transmitting the data signal Dm transferred to the data line DL to the driving source region S1 of the driving thin-film transistor T1.

Figure 5:
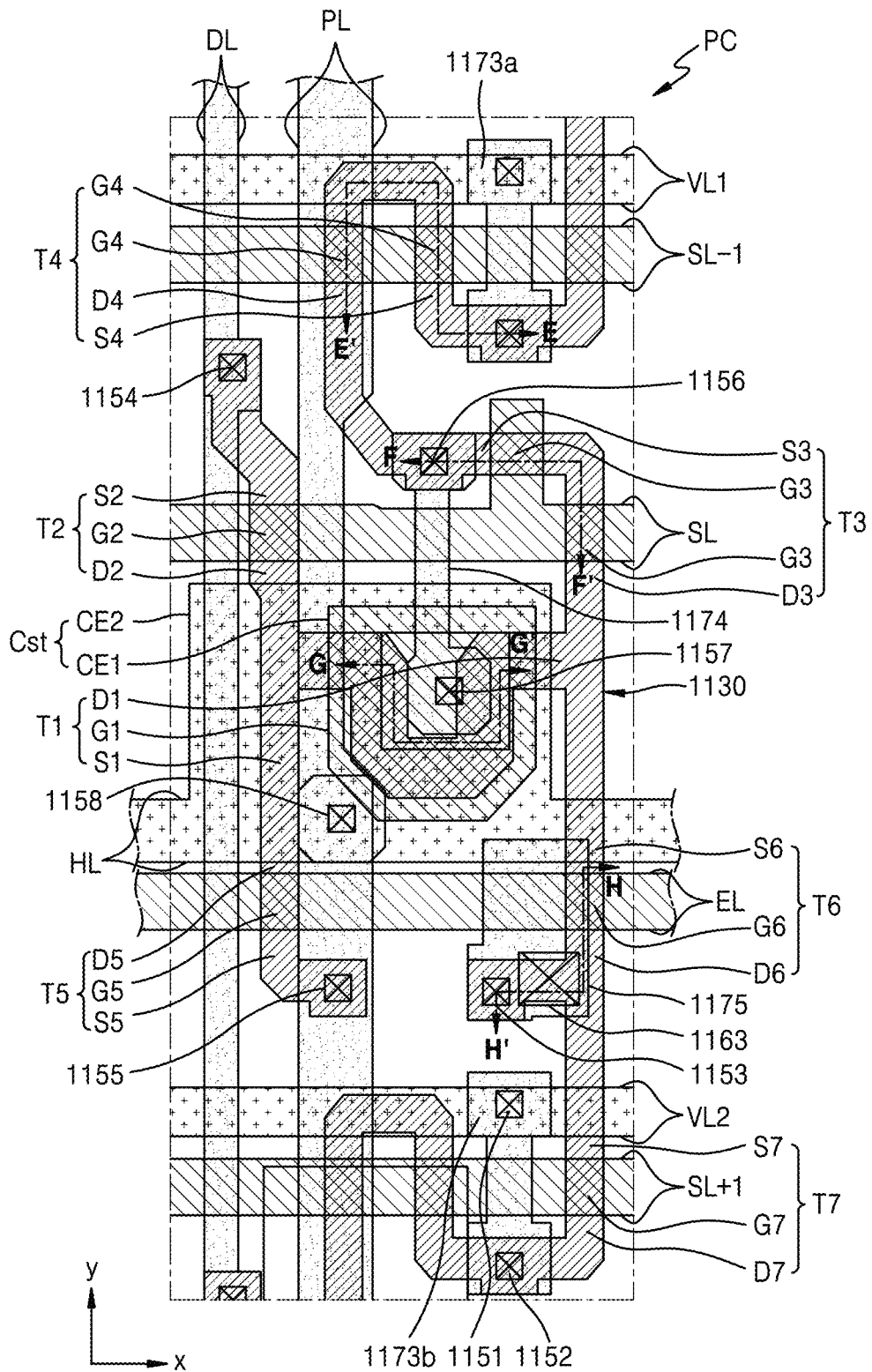
FIG. 5 is a schematic layout illustrating an example of a pixel circuit in the display device of FIG. 1.

A compensation thin-film transistor T3, which is a third transistor connected between a third node N3, which is between the driving thin-film transistor T1 and the emission control thin-film transistor T6, and the first node N1, may diode-connect the driving thin-film transistor T1 in response to a voltage applied to a compensation gate electrode G3 (i.e., a third gate electrode) (see FIG. 5). That is, the compensation gate electrode G3 of the compensation thin-film transistor T3 may be connected to the scan line SL, and a compensation drain region D3 (see FIG. 5) of the compensation thin-film transistor T3 may be connected to the driving drain region D1 of the driving thin-film transistor T1 and connected to the pixel electrode of the organic light-emitting diode, which is the display element DPE, via the emission control thin film transistor T6. A compensation source region S3 (see FIG. 5) of the compensation thin-film transistor T3 may be connected to a lower electrode CE1 of the storage capacitor Cst, a first initialization drain region D4 (see FIG. 5) of the first initialization thin-film transistor T4, and the driving gate electrode G1 of the driving thin-film transistor T1.

The compensation thin-film transistor T3 may be configured to be turned on according to the scan signal Sn received through the scan line SL and electrically connect the driving gate electrode G1 of the driving thin-film transistor T1 to the driving drain region D1 thereof to diode-connect the driving thin-film transistor T1. Accordingly, even when threshold voltages Vth of the driving thin-film transistors T1 of several pixels are different from one another, when the same data signal Dm is applied to the several pixels, driving currents flowing through organic light-emitting diodes in the several pixels may have substantially the same magnitude. The compensation thin-film transistor T3 may have a dual gate electrode if necessary.

The first initialization thin-film transistor T4, which is a fourth transistor, may be connected between the first node N1 and the first initialization voltage line VL1, and may be configured to initialize the voltage of the driving gate electrode G1 in response to a voltage applied to a first initialization gate electrode G4 (see FIG. 5) that is a fourth gate electrode. That is, the first initialization gate electrode G4 of the first initialization thin-film transistor T4 may be connected to the previous scan line SL−1, and a first initialization source region S4 (see FIG. 5) of the first initialization thin-film transistor T4 may be connected to the first initialization voltage line VL1. A first initialization drain region D4 of the first initialization thin-film transistor T4 may be connected to the lower electrode CE1 of the storage capacitor Cst, the compensation source region S3 of the compensation thin-film transistor T3, and the driving gate electrode G1 of the driving thin-film transistor T1. The first initialization thin-film transistor T4 may be configured to be turned on according to the previous scan signal Sn−1 received through the previous scan line SL−1 and perform an initialization operation of initializing the voltage of the driving gate electrode G1 of the driving thin-film transistor T1 by transferring the initialization voltage Vint to the driving gate electrode G1 of the driving thin-film transistor T1.

The operation control thin-film transistor T5, which is a fifth transistor, may be connected between the second node N2 and the power supply voltage line PL, and may be configured to be turned on in response to a voltage applied to an operation control gate electrode G5 (see FIG. 5) that is a fifth gate electrode. That is, the operation control gate electrode G5 of the operation control thin-film transistor T5 may be connected to the emission control line EL, and an operation control source region S5 (see FIG. 5) of the operation control thin-film transistor T5 may be connected to the power supply voltage line PL. An operation control drain region D5 (see FIG. 5) of the operation control thin-film transistor T5 may be connected to the driving source region S1 of the driving thin-film transistor T1 and the switching drain region D2 of the switching thin-film transistor T2.

The emission control thin-film transistor T6, which is a sixth transistor, may be connected between the third node N3 and the display element DPE, and may be configured to be turned on in response to a voltage applied to an emission control gate electrode G6 (i.e., a sixth gate electrode) (see FIG. 5) from the emission control line EL. That is, the emission control gate electrode G6 of the emission control thin-film transistor T6 may be connected to the emission control line EL, and an emission control source region S6 (see FIG. 5) of the emission control thin-film transistor T6 may be connected to the driving drain region D1 of the driving thin-film transistor T1 and the compensation drain region D3 of the compensation thin-film transistor T3. An emission control drain region D6 (see FIG. 5) of the emission control thin-film transistor T6 may be electrically connected to a second initialization source region S7 (see FIG. 5) of the second initialization thin-film transistor T7 and the display element DPE.

The operation control thin-film transistor T5 and the emission control thin-film transistor T6 may be simultaneously turned on according to the emission control signal En received through the emission control line EL, and the driving voltage ELVDD may be transmitted to the organic light-emitting diode, that is, the display element DPE, to allow a driving current to flow through the organic light-emitting diode.

A second initialization gate electrode G7 (i.e., a seventh gate electrode) (see FIG. 5) of the second initialization thin-film transistor T7 that is a seventh transistor may be connected to the subsequent scan line SL+1, and a second initialization source region S7 of the second initialization thin-film transistor T7 may be connected to the emission control drain region D6 of the emission control thin-film transistor T6 and the display element DPE. A second initialization drain region D7 (see FIG. 5) of the second initialization thin-film transistor T7 may be connected to the second initialization voltage line VL2.

When the scan line SL and the subsequent scan line SL+1 are electrically connected to each other, the same scan signal Sn may be applied to the scan line SL and the subsequent scan line SL+1. In this case, the second initialization thin-film transistor T7 may be turned on according to the scan signal Sn transmitted through the subsequent scan line SL+1 and initialize the pixel electrode of the organic light-emitting diode, that is, the display element DPE. In an embodiment, the second initialization thin-film transistor T7 may be omitted.

An upper electrode CE2 of the storage capacitor Cst may be connected to the power supply voltage line PL, and a common electrode of the organic light-emitting diode that is the display element DPE may be connected to an electrode power supply line ELVSS which supplies a common voltage. Accordingly, the organic light-emitting diode may receive a driving current from the driving thin-film transistor T1 and emit light to display an image.

As described above, the compensation thin-film transistor T3 may have a dual gate electrode. That is, the compensation thin-film transistor T3 may have two compensation gate electrodes G3. In an embodiment, the first initialization thin-film transistor T4 may also have a dual gate electrode.

Figure 6:
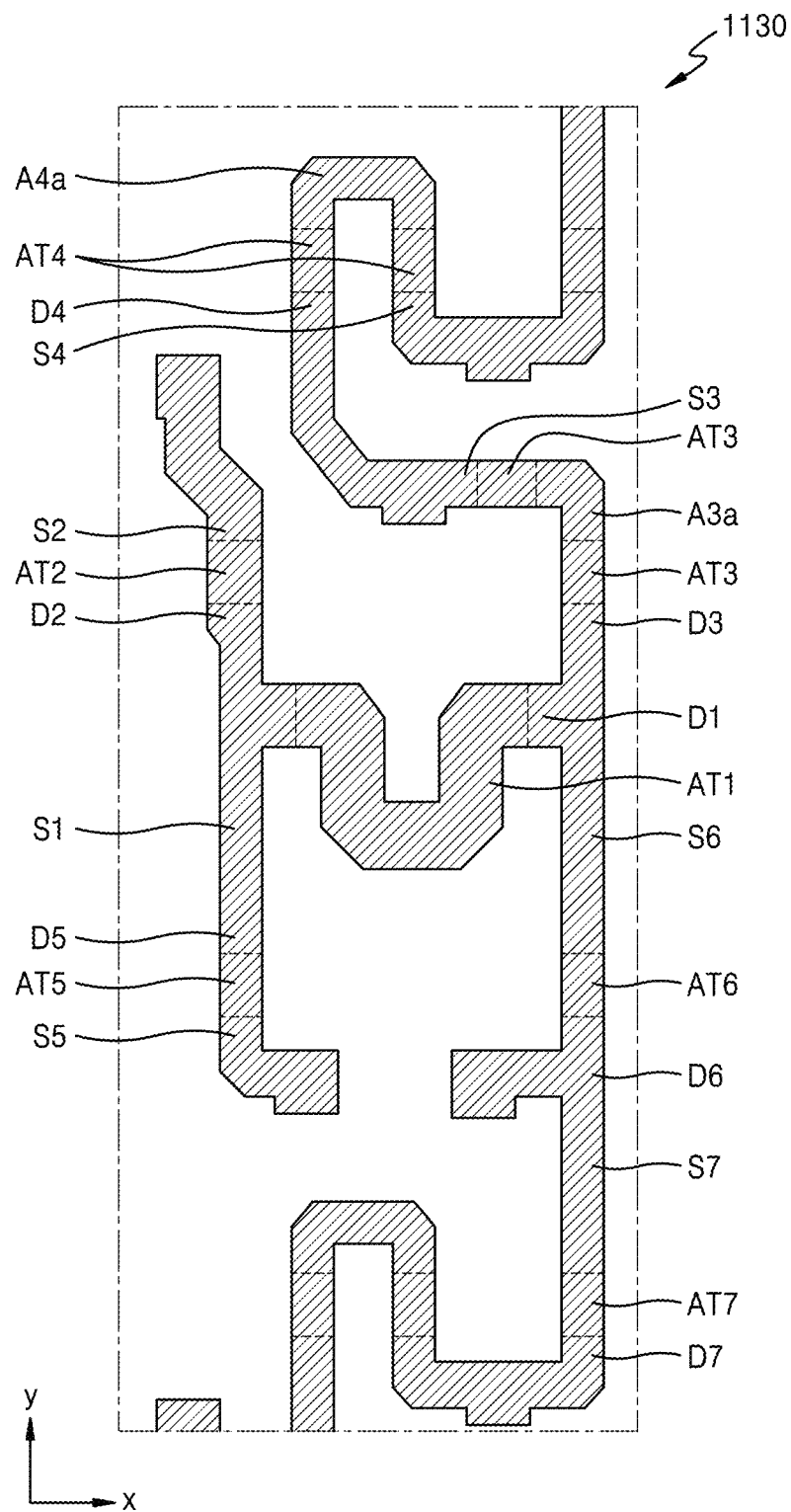
FIG. 6 is a schematic layout illustrating a semiconductor layer in FIG. 5.
Figure 7:
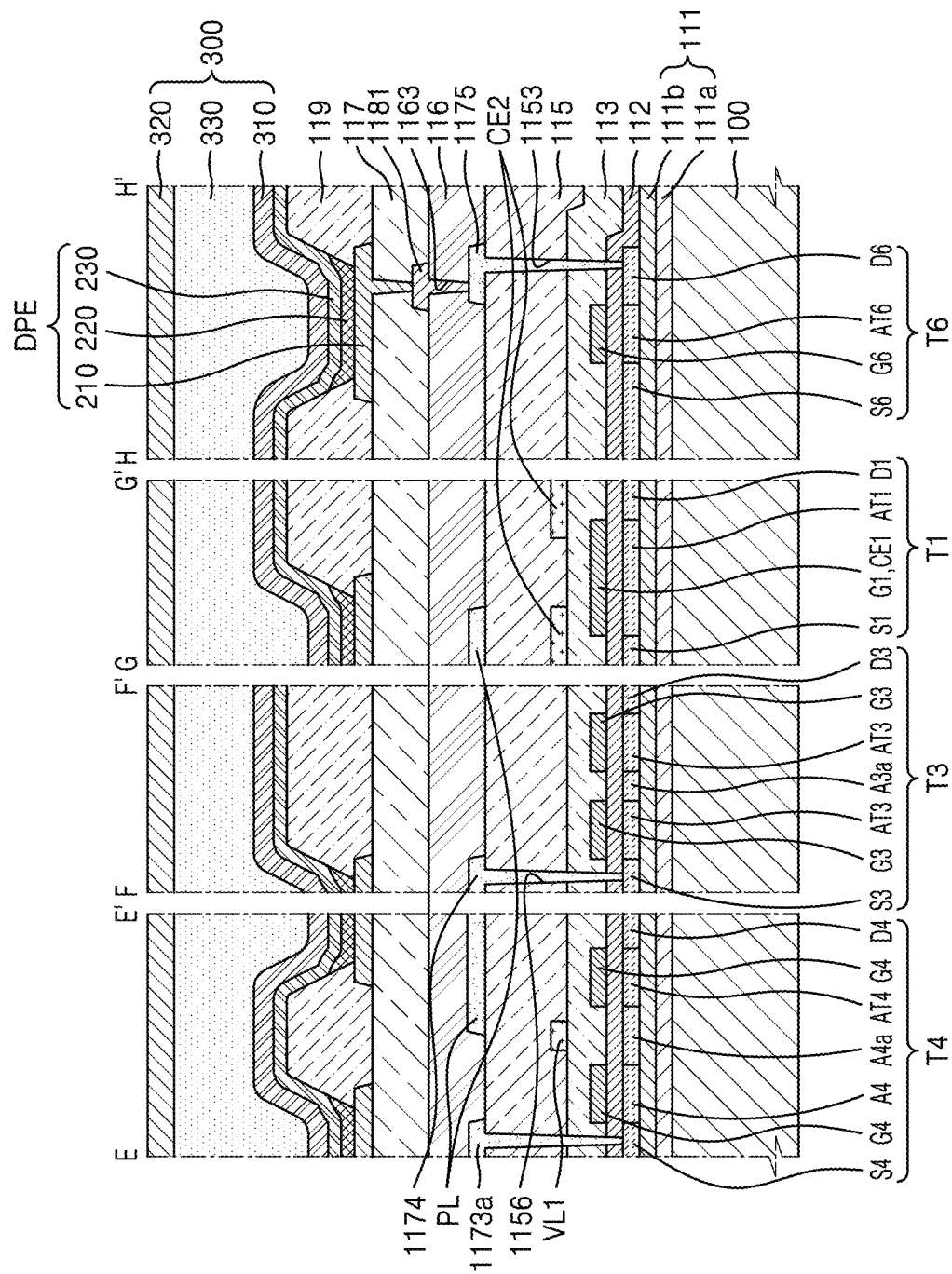
FIG. 7 is a schematic cross-sectional view illustrating cross-sections of the display device taken along lines E-E', F-F', G-G', and H-H' in FIG. 5.

FIG. 5 is a schematic layout illustrating an example of a pixel circuit PC disposed in the central area CA of the display panel 10 in the display device 1 of FIG. 1, and schematically shows positions of a plurality of thin-film transistors T1 to T7, a capacitor Cst, and the like. FIG. 6 is a schematic layout illustrating a semiconductor layer 1130 in FIG. 5, and FIG. 7 is a schematic cross-sectional view illustrating cross-sections taken along lines E-E', F-F', G-G', and H-H' in FIG. 5. In the cross-sectional view, the size of each component is exaggerated and/or reduced for convenience. This is also the same in other cross-sectional views to be described below.

The driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin film transistor T7 may be arranged along the semiconductor layer 1130. Some regions of the semiconductor layer 1130 may form semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. That is, some regions of the semiconductor layer 1130 may form an active region, a source region, or a drain region of each of the thin-film transistors T1 to T7.

The semiconductor layer 1130 may be formed on a substrate 100. A buffer layer 111 may be formed on the substrate 100, and the semiconductor layer 1130 may be formed on the buffer layer 111.

The substrate 100 may include a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. Alternatively, the substrate 100 may include two layers including the polymer resin and a barrier layer between the two layers. In this case, the barrier layer may include an inorganic material, such as silicon nitride (SiNx), silicon oxide ($SiO_2$), and/or silicon oxynitride (SiON). The substrate 100 may alternatively include glass or metal.

The buffer layer 111 may reduce or block penetration of foreign matter, moisture, or external air from the bottom of the substrate 100, and may provide a flat surface on the substrate 100. The buffer layer 111 may include an inorganic material, such as an oxide or a nitride, an organic material, or an organic-inorganic composite, and may have a single-layer or multi-layer structure including an inorganic material and an organic material. For example, the buffer layer 111 may have a structure in which a first buffer layer 111a and a second buffer layer 111b are stacked, in which case the first buffer layer 111a and the second buffer layer 111b may include different materials. For example, the first buffer layer 111a may include silicon nitride, and the second buffer layer 111b may include silicon oxide.

As such, when the first buffer layer 111a includes silicon nitride, hydrogen may be included when the silicon nitride is formed. Through this, carrier mobility of the semiconductor layer 1130 formed on the buffer layer 111 may be improved, and thus, electrical characteristics of the thin-film transistors T1 to T7 may be improved. In addition, the semiconductor layer 1130 may include a silicon material. In this case, the interfacial junction characteristics between the semiconductor layer 1130 including a silicon material and the second buffer layer 111b including silicon oxide may be improved, and thus, the electrical characteristics of the thin-film transistors T1 to T7 may be improved.

The semiconductor layer 1130 may include low temperature poly-silicon ("LTPS"). Polysilicon materials such as LTPS have high electron mobility (100 $cm^2/Vs$ or more), low energy consumption, and excellent reliability. As another example, the semiconductor layer 1130 may include amorphous silicon and/or an oxide semiconductor. Alternatively, some semiconductor layers of the plurality of thin-film transistors may include LTPS, and other semiconductor layers may include amorphous silicon and/or an oxide semiconductor.

Source regions and drain regions of the semiconductor layer 1130 may be doped with impurities, and the impurities may include N-type impurities or P-type impurities. Each of the source regions and each of the drain regions may correspond to a source electrode and a drain electrode, respectively. The source region and the drain region may be changed from each other according to the properties of the thin-film transistor. Hereinafter, the terms "source region" and "drain region" are used instead of the source electrode and the drain electrode. The equivalent circuit diagram of FIG. 4 shows an example in which some portions of the semiconductor layer 1130 are doped with P-type impurities and thus the thin-film transistors T1 to T7 are implemented as p-channel MOSFETs ("PMOS"). Other portions of the semiconductor layer 1130 may also be doped with impurities to function as wiring lines for electrically connecting the thin-film transistors T1 to T7 and/or the capacitor Cst to each other.

A first gate insulating layer 112 may be disposed on the semiconductor layer 1130, and the driving gate electrode G1, the scan line SL, the previous scan line SL−1, the subsequent scan line SL+1, and the emission control line EL may be disposed on the first gate insulating layer 112. These components disposed on the first gate insulating layer 112 may be collectively referred to as a first gate layer. The first gate insulating layer 112 may include $SiO_2$, SiNx, SiON, aluminum oxide ($Al_2O_3$), titanium oxide ($TiO_2$), tantalum oxide ($Ta_2O_5$), hafnium oxide ($HfO_2$), zinc oxide (ZnO or $ZnO_2$), or the like.

The driving gate electrode G1 may overlap a first active region AT1 of the driving thin-film transistor T1 in a plan view. A region, which overlaps a second active region AT2 of the switching thin-film transistor T2, in the scan line SL may be the switching gate electrode G2, and a region, which overlaps a third active region AT3 of the compensation thin-film transistor T3, in the scan line SL may be the compensation gate electrode G3. A region, which overlaps a fourth active region AT4 of the first initialization thin-film transistor T4, in the previous scan lines SL−1 may be the first initialization gate electrode G4, and a region, in which overlaps a seventh active region AT7 of the second initialization thin-film transistor T7, in the subsequent scan lines SL+1 may be the second initialization gate electrode G7. A region, in which overlaps a fifth active region AT5 of the operation control thin-film transistor T5, in the emission control line EL may be the operation control gate electrode G5, and a region, in which overlaps a sixth active region AT6 of the emission control thin-film transistor T6, in the emission control line EL may be the emission control gate electrode G6. Because the first initialization thin-film transistor T4 has a dual gate electrode, there is an area A4a between two fourth active regions AT4. Similarly, because the compensation thin-film transistor T3 has a dual gate electrode, there is an area A3a between two third active regions AT3.

The driving gate electrode G1, the scan line SL, the previous scan line SL−1, the subsequent scan line SL+1, and the emission control line EL may each include a conductive material including molybdenum (Mo), aluminum (Al), copper (Cu), or titanium (Ti), and may each have a multi-layer structure or single-layer structure including the conductive material. For example, the driving gate electrode G1, the scan line SL, the previous scan line SL−1, the subsequent scan line SL+1, and the emission control line EL may each have a multi-layer structure of Mo/A1 or a multi-layer structure of Mo/Al/Mo.

A second gate insulating layer 113 may be provided on the driving gate electrode G1, the scan line SL, the previous scan line SL−1, the subsequent scan line SL+1, and the emission control line EL. The second gate insulating layer 113 may include $SiO_2$, SiNx, SiON, $Al_2O_3$, $TiO_2$, $Ta_2O_5$, $HfO_2$, ZnO or $ZnO_2$, or the like.

A horizontal voltage line HL, the first initialization voltage line VL1, and the second initialization voltage line VL2 may be disposed on the second gate insulating layer 113. These components disposed on the second gate insulating layer 113 may be collectively referred to as a second gate layer. The horizontal voltage line HL may overlap at least a portion of the driving gate electrode G1 in a plan view to form the storage capacitor Cst together with the driving gate electrode G1.

The lower electrode CE1 of the storage capacitor Cst may be formed integrally with the driving gate electrode G1 of the driving thin-film transistor T1. For example, the driving gate electrode G1 of the driving thin-film transistor T1 may function as the lower electrode CE1 of the storage capacitor Cst. A region of the horizontal voltage line HL, which overlaps the driving gate electrode G1 in a plan view, may be the upper electrode CE2 of the storage capacitor Cst. Accordingly, the second gate insulating layer 113 may function as a dielectric layer of the storage capacitor Cst.

The horizontal voltage line HL, the first initialization voltage line VL1, and the second initialization voltage line VL2 may each include a conductive material including aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), or the like, and may each have a multi-layer structure or single-layer structure including the conductive material. For example, the horizontal voltage line HL, the first initialization voltage line VL1, and the second initialization voltage line VL2 may each have a multi-layer structure of Mo/Al or a multi-layer structure of Mo/Al/Mo.

An interlayer-insulating layer 115 may be disposed on the horizontal voltage line HL, the first initialization voltage line VL1, and the second initialization voltage line VL2. The interlayer-insulating layer 115 may include $SiO_2$, SiNx, SiON, $Al_2O_3$, $TiO_2$, $Ta_2O_5$, $HfO_2$, ZnO or $ZnO_2$, or the like.

The data line DL, the power supply voltage line PL, first and second initialization connection lines 1173a and 1173b, a node connection line 1174, and a connection metal 1175 may be disposed on the interlayer-insulating layer 115. These components disposed on the interlayer-insulating layer 115 may be collectively referred to as a first source/drain layer. The data line DL, the power supply voltage line PL, the node connection line 1174, and the connection metal 1175 may each include a conductive material including Mo, Al, Cu, or Ti, and may each have a multi-layer structure or single-layer structure including the conductive material. For example, the data line DL, the power supply voltage line PL, the node connection line 1174, and the connection metal 1175 may each have a multi-layer structure of Ti/Al/Ti.

The data line DL may be connected to the switching source region S2 of the switching thin-film transistor T2 through a contact hole 1154. In an embodiment, a portion of the data line DL may be understood as a switching source electrode.

The power supply voltage line PL may be connected to the upper electrode CE2 of the capacitor Cst through a contact hole 1158 formed in the interlayer-insulating layer 115. Accordingly, the horizontal voltage line HL may have the same voltage level (a constant voltage) as the power supply voltage line PL. Also, the power supply voltage line PL may be connected to the operation control source region S5 through a contact hole 1155.

The first initialization voltage line VL1 may be connected to the first initialization thin-film transistor T4 through the first initialization connection line 1173a, and the second initialization voltage line VL2 may be connected to the second initialization thin-film transistor T7 through the second initialization connection line 1173b and contact holes 1151 and 1152. The first initialization voltage line VL1 and the second initialization voltage line VL2 may have the same constant voltage (e.g., −2 volts).

One end of the node connection line 1174 may be connected to the compensation source region S3 through a contact hole 1156, and the other end may be connected to the driving gate electrode G1 through a contact hole 1157.

The connection metal 1175 may be connected to a semiconductor layer of the emission control thin-film transistor T6 through a contact hole 1153 passing through the interlayer-insulating layer 115, the second gate insulating layer 113, and the first gate insulating layer 112.

A first planarization layer 116 may be disposed on the data line DL, the power supply voltage line PL, the first and second initialization connection lines 1173a and 1173b, the node connection line 1174, and the connection metal 1175. The first planarization layer 116 may have an approximately flat top surface. The first planarization layer 116 may include an organic material. For example, the first planarization layer 116 may include a commercial polymer such as benzocyclobutene ("BCB"), polyimide, hexamethyldisiloxane ("HMDSO"), polymethyl methacrylate ("PMMA") or polystyrene ("PS"), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. In an embodiment, the first planarization layer 116 may include an inorganic material. In this case, the first planarization layer 116 may include $SiO_2$, SiNx, SiON, $Al_2O_3$, $TiO_2$, $Ta_2O_5$, $HfO_2$, ZnO or $ZnO_2$, or the like. When the first planarization layer 116 includes an inorganic material, chemical planarization polishing may be performed in some cases. The first planarization layer 116 may include both an organic material and an inorganic material.

A connection wiring line 1181 may be disposed on the first planarization layer 116. Components disposed on the first planarization layer 116 may be collectively referred to as a second source/drain layer. The connection wiring line 1181 may include a conductive material including Mo, Al, Cu, or Ti, and may have a multi-layer structure or single-layer structure including the conductive material. For example, the connection wiring line 1181 may have a multi-layer structure of Ti/Al/Ti. The connection wiring line 1181 may be electrically connected to the emission control thin-film transistor T6 by being connected to the connection metal 1175 through a contact hole 1163 passing through the first planarization layer 116. For reference, in the layout of FIG. 5, only the conductive layers and the semiconductor layer 1130, located below the first planarization layer 116, are shown for convenience, and the connection wiring line 1181 and the like, located above the first planarization layer 116, are not shown.

A second planarization layer 117 may be disposed on the connection wiring line 1181. The second planarization layer 117 may have an approximately flat top surface. The second planarization layer 117 may include an organic material. For example, the second planarization layer 117 may include a commercial polymer such as BCB, polyimide, HMDSO, PMMA or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. In an embodiment, the second planarization layer 117 may include an inorganic material. In this case, the second planarization layer 117 may include $SiO_2$, SiNx, SiON, $Al_2O_3$, $TiO_2$, $Ta_2O_5$, $HfO_2$, ZnO or $ZnO_2$, or the like. When the second planarization layer 117 includes an inorganic material, chemical planarization polishing may be performed in some cases. The second planarization layer 117 may include both an organic material and an inorganic material.

As described above, one pixel circuit PC is illustrated in FIG. 4, and in FIGS. 5 to 7, an example of one pixel circuit PC disposed in the central area CA of the display panel 10 included in the display device 1 of FIG. 1 is schematically illustrated. In the central area CA, pixel circuits PC may be arranged in the first direction (i.e., the x direction or the −x direction) and the second direction (i.e., they direction or the −y direction). In this case, the first initialization voltage line VL1, the previous scan line SL−1, the second initialization voltage line VL2, and the subsequent scan line SL+1 may be shared by two pixel circuits PC disposed adjacently in the second direction.

That is, the first initialization voltage line VL1 and the previous scan line SL−1 may be electrically connected to a second initialization thin-film transistor T7 of another pixel circuit PC disposed above the pixel circuit PC (in the +y direction) shown in FIG. 5. Accordingly, a previous scan signal applied to the previous scan line SL−1 may be transmitted as a subsequent scan signal to the second initialization thin-film transistor T7 of the other pixel circuit PC. Similarly, the second initialization voltage line VL2 and the subsequent scan line SL+1 may be electrically connected to a first initialization thin-film transistor T4 of another pixel circuit PC disposed below the pixel circuit PC (in the −y direction) shown in FIG. 5 and transmit an initialization voltage and a previous scan signal to the first initialization thin-film transistor T4 of the other pixel circuit PC. In this sense, the previous scan line SL−1 and the subsequent scan line SL+1 may be substantially the same. In addition, the first initialization voltage line VL1 and the second initialization voltage line VL2 may be the same initialization voltage line VL (see FIG. 4).

The organic light-emitting diode that is the display element DPE may include a pixel electrode 210, a common electrode 230, and an intermediate layer 220 disposed therebetween and including an emission layer.

As shown in FIG. 7, the pixel electrode 210 may be disposed on the second planarization layer 117 having a flat top surface. The pixel electrode 210 may be connected to the connection wiring line 1181 through a contact hole formed in the second planarization layer 117 and be electrically connected to the emission control drain region D6. In addition, as shown in FIG. 7, in the central area CA, the organic light-emitting diode, which is the display element DPE, may overlap the pixel circuit PC electrically connected thereto in a plan view.

The pixel electrode 210 may be a (semi) transmissive electrode or a reflective electrode. In some embodiments, the pixel electrode 210 may include a reflective layer including Ag, Mg, Al, Pt, Pd, Au, Ni, Nd, Ir, Cr, and a compound thereof, and a transparent or translucent electrode layer formed on the reflective layer. The transparent or translucent electrode layer may include at least one selected from the group including indium tin oxide ("ITO"), indium zinc oxide ("IZO"), zinc oxide (ZnO or $ZnO_2$), indium oxide ($In_2O_3$), indium gallium oxide ("IGO"), and aluminum zinc oxide ("AZO"). In some embodiments, the pixel electrode 210 may have a stacked structure of ITO/Ag/ITO.

A pixel-defining layer 119 may be disposed on the second planarization layer 117, and the pixel-defining layer 119 may have an opening through which a central portion of the pixel electrode 210 is exposed, thereby defining an emission area of the pixel PX. In addition, the pixel-defining layer 119 may increase the distance between the edge of the pixel electrode 210 and the common electrode 230 above the pixel electrode 210, thereby preventing arcs from occurring at the edge of the pixel electrode 210. The pixel-defining layer 119 may include an organic insulating material, such as polyimide, polyamide, acrylic resin, BCB, HMDSO, or phenol resin, and may be formed by spin coating or the like.

The intermediate layer 220 may include an organic emission layer. The organic emission layer may include an organic material including a fluorescent or phosphorescent material emitting red, green, blue, or white light. The organic emission layer may include a low molecular weight organic material or a high molecular weight organic material, and below and above the organic emission layer, a functional layer, such as a hole transport layer ("HTL"), a hole injection layer ("HIL"), an electron transport layer ("ETL"), and an electron injection layer ("EIL"), may be optionally further disposed. The intermediate layer 220 may be disposed to correspond to each of the plurality of pixel electrodes 210. However, the disclosure is not limited thereto, and among the layers in the intermediate layer 220, a layer, such as the HTL, the HIL, the ETL, or the EIL, may be integrally formed as one body over the plurality of pixel electrodes 210 in another embodiment.

The common electrode 230 may be a transmissive electrode or a reflective electrode. In some embodiments, the common electrode 230 may be a transparent or translucent electrode, and may include a metal thin film having a small work function, which includes Li, Ca, LiF, Al, Ag, Mg, or a compound thereof. In addition, the common electrode 230 may further include a transparent conductive oxide ("TCO") layer including ITO, IZO, ZnO, $ZnO_2$, $In_2O_3$, or the like, in addition to the metal thin film. The common electrode 230 may be integrally formed as one body to correspond to the plurality of pixel electrodes 210.

An encapsulation layer 300 including a first inorganic encapsulation layer 310, a second inorganic encapsulation layer 320, and an organic encapsulation layer 330 therebetween may be disposed over the common electrode 230.

The first inorganic encapsulation layer 310 and the second inorganic encapsulation layer 320 may each include $SiO_2$, SiNx, SiON, $Al_2O_3$, $TiO_2$, $Ta_2O_5$, $HfO_2$, ZnO or $ZnO_2$, or the like. The organic encapsulation layer 330 may include polyethylene terephthalate, polyethylene naphthalate, polycarbonate, polyimide, polyethylene sulfonate, polyoxymethylene, polyarylate, hexamethyldisiloxane, acrylic resin (e.g., polymethyl methacrylate or polyacrylic acid), or any combination thereof.

Figure 8:
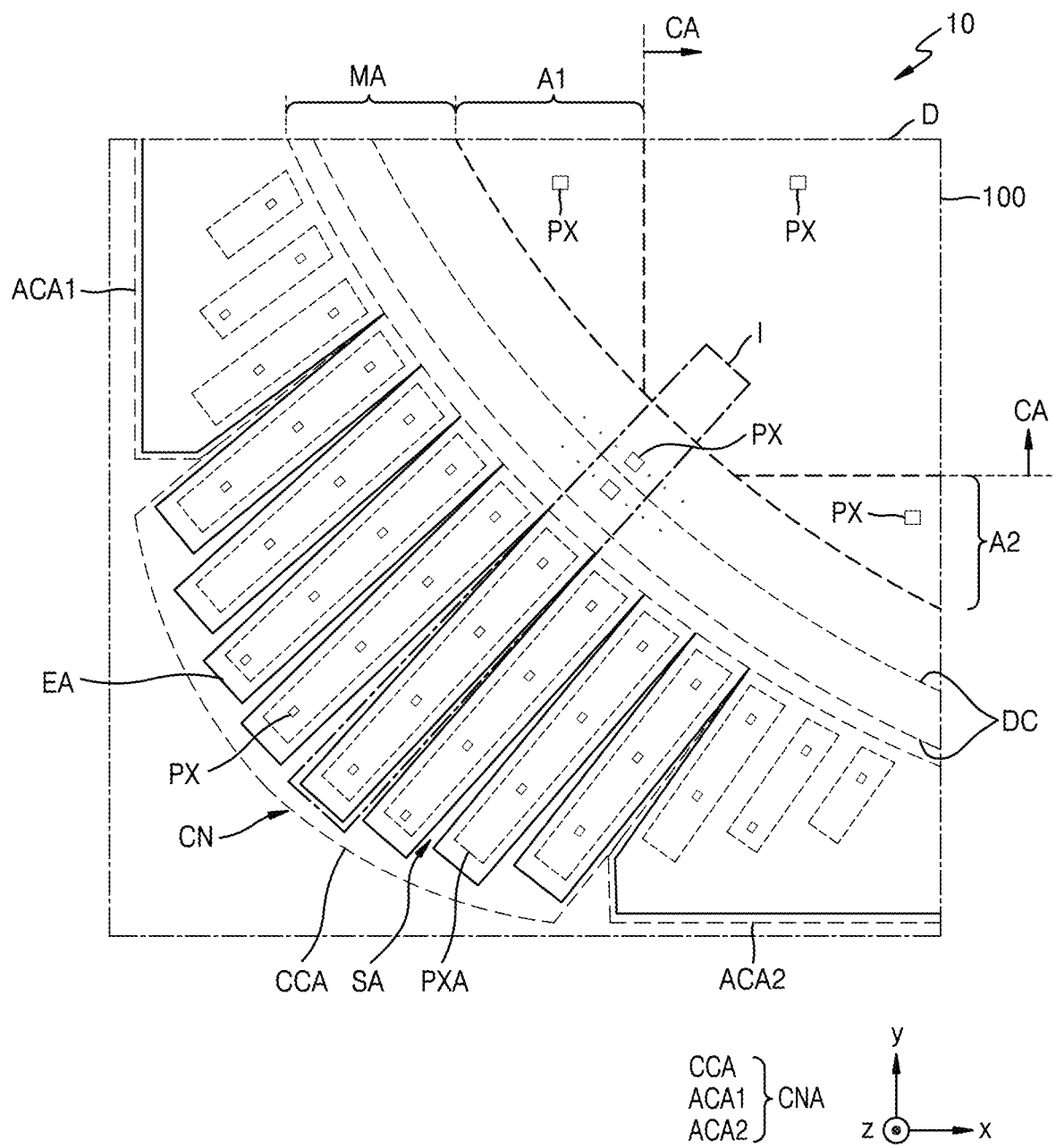
FIG. 8 is an enlarged conceptual view illustrating a region D of FIG. 3.
Figure 9:
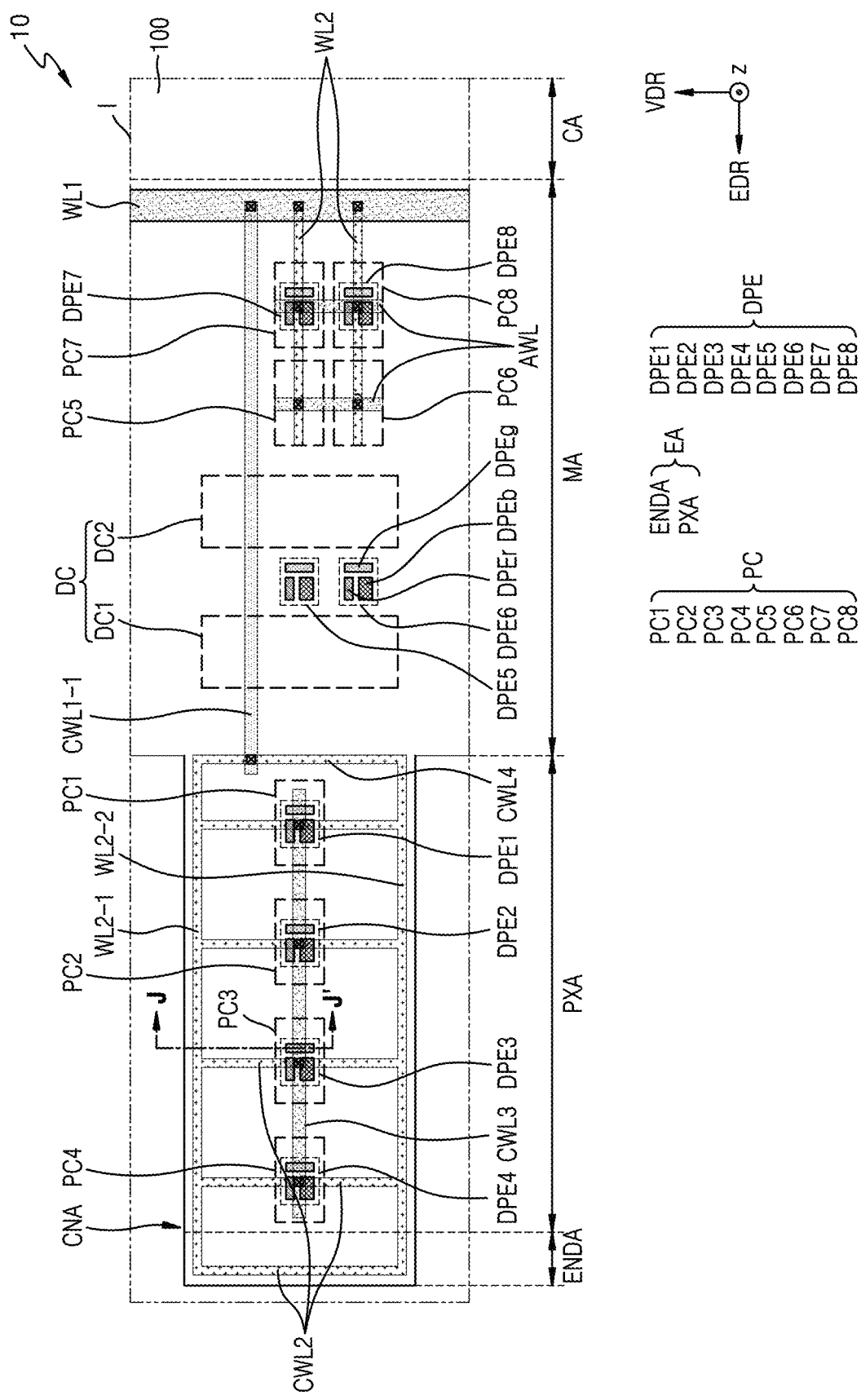
FIG. 9 is an enlarged conceptual view illustrating a region I of FIG. 8.

FIG. 8 is an enlarged conceptual view illustrating a region D of FIG. 3, and FIG. 9 is an enlarged conceptual view illustrating a region I of FIG. 8.

As shown in FIGS. 8 and 9, the display panel 10 in the display device 1 may include a substrate 100, a pixel circuit PC, a display element DPE, and a driving circuit DC. The substrate 100 may include a central area CA, a first area A1, a second area A2, a corner area CNA, and an intermediate area MA.

The first area A1 may be adjacent to the central area CA in a first direction (an x direction or a −x direction). The first area A1 may extend in a second direction (a y direction or a −y direction). The second area A2 may be adjacent to the central area CA in the second direction (a y direction or a −y direction). The second area A2 may extend in the first direction (an x direction or a −x direction).

The corner area CNA may be an area disposed at a corner CN. That is, the corner area CNA may be an area where an edge of the display panel 10 in the first direction meets an edge of the display panel 10 in the second direction. The corner area CNA may surround at least a part of the central area CA, the first area A1, and the second area A2. Alternatively, the corner area CNA may surround at least a part of the central area CA, the first area A1, the second area A2, and the intermediate area MA. The corner area CNA may include a central corner area CCA, a first adjacent corner area ACA1, and a second adjacent corner area ACA2.

The central corner area CCA may include an extension area EA. The extension area EA may extend in a direction away from the central area CA (i.e., extension direction EDR). The display panel 10 may include a plurality of extension areas EA. Each of the plurality of extension areas EA may extend in a direction away from the central area CA. For example, the plurality of extension areas EA may extend in a direction crossing the first direction (the x direction or the −x direction) and the second direction (the y direction or the −y direction).

A separation area SA may be an empty space defined between extension areas EA adjacent to each other. The separation area SA may be an area in which components of the display panel 10 are not disposed. When the central corner area CCA is bent at the corner CN, a compressive strain occurring in the central corner area CCA may be greater than a tensile strain occurring in the central corner area CCA. However, in the case of the display device 1 according to the present embodiment, because the separation area SA is defined between extension areas EA adjacent to each other, the display panel 10 may be bent without being damaged in the central corner area CCA.

The first adjacent corner area ACA1 may be adjacent to the central corner area CCA. At least a portion of the first area A1 and the first adjacent corner area ACA1 may be located in the first direction (the x direction or the −x direction). An end of the first adjacent corner area ACA1 in a direction toward the central corner area CCA may be apart from an end of the central corner area CCA in a direction toward the first adjacent corner area ACA1. The first adjacent corner area ACA1 may appear to be bent in a cross-section (a zx cross-section) in the first direction and to be not bent in a cross-section (a yz cross-section) in the second direction. The separation area SA may not be defined inside the first adjacent corner area ACA1.

The second adjacent corner area ACA2 may also be adjacent to the central corner area CCA. At least a portion of the second area A2 and the second adjacent corner area ACA2 may be located in the second direction (the y-direction or −y-direction). An end of the second adjacent corner area ACA2 in a direction toward the central corner area CCA may be apart from an end of the central corner area CCA in a direction toward the second adjacent corner area ACA2. The second adjacent corner area ACA2 may appear not to be bent in the cross-section (the zx cross-section) in the first direction and to be bent in the cross-section (the yz cross-section) in the second direction. The separation area SA may not be defined inside the second adjacent corner area ACA2.

The intermediate area MA may be located between the central area CA and the corner area CNA. The intermediate area MA may extend between the central area CA and the first adjacent corner area ACA1. Also, the intermediate area MA may extend between the central area CA and the second adjacent corner area ACA2. The intermediate area MA may surround at least a part of the central area CA, the first area A1, and the second area A2.

As shown in FIG. 8, the plurality of pixels PX may be disposed in the central area CA, the first area A1, the second area A2, the corner area CNA, and the intermediate area MA. Accordingly, the display panel 10 may display images in the central area CA, the first area A1, the second area A2, the corner area CNA, and the intermediate area MA. The pixel PX may include a display element DPE.

As shown in FIG. 9, each of the plurality of extension areas EA may include a pixel area PXA and an end area ENDA, and in the central corner area CCA, the display element DPE in the pixel PX may be disposed in the pixel area PXA. In each of the plurality of extension areas EA, display elements DPE may be arranged in an extension direction EDR of the extension area EA.

As shown in FIG. 9, a first wiring line WL1 may be disposed in the intermediate area MA. The first wiring line WL1 may extend in an extension direction of the intermediate area MA. The first wiring line WL1 may extend to surround at least a part of the central area CA, the first area A1, and the second area A2. The first wiring line WL1 may be a driving power supply line for transmitting the driving voltage ELVDD. That is, the first wiring line WL1 may transmit the driving voltage ELVDD to be applied to driving thin-film transistors T1 included in the pixel circuits PC in the display panel 10. The first wiring line WL1 may be located to be biased toward the central area CA, the first area A1, and the second area A2 within the intermediate area MA.

The first wiring line WL1 may be a component of the first source/drain layer described above. That is, the first wiring line WL1 may be disposed on the interlayer-insulating layer 115. Accordingly, the first wiring line WL1 may be formed of the same material as and simultaneously with the data line DL, the power supply voltage line PL, the first and second initialization connection lines 1173a and 1173b, the node connection line 1174, and the connection metal 1175, which are located in the central area CA. In addition, the first wiring line WL1 may have the same layer structure as the data line DL, the power supply voltage line PL, the first and second initialization connection lines 1173a and 1173b, the node connection line 1174, and the connection metal 1175.

In each of the extension areas EA, as shown in FIG. 9, a second-first wiring line WL2-1, a second-second wiring line WL2-2, a plurality of second connection wiring lines CWL2, and a third connection wiring line CWL3 may be arranged. In addition, a first-first connection wiring line CWL1-1 may be disposed in the intermediate area MA.

The second-first wiring line WL2-1 may extend along any one edge of opposite side edges of the extension area EA in the extension direction EDR. In addition, the second-second wiring line WL2-2 may extend along the other edge of the opposite side edges of the extension area EA in the extension direction EDR. The plurality of second connection wiring lines CWL2 may connect the second-first wiring line WL2-1 to the second-second wiring line WL2-2 in the extension area EA. Accordingly, each of the plurality of second connection wiring lines CWL2 may extend in a direction crossing the extension direction EDR of the extension area EA, for example, in a vertical direction VDR.

In an embodiment, each of the second-first wiring line WL2-1 and the second-second wiring line WL2-2 may extend in the extension direction EDR of the extension area EA, and thus, ends of the second-first wiring line WL2-1 and the second-second wiring line WL2-2 in a direction away from the central area CA may be located in the end area ENDA outside the pixel area PXA. In this case, one of the plurality of second connection wiring lines CWL2 may be located in the end area ENDA and connect an end of the second-first wiring line WL2-1 to an end of the second-second wiring line WL2-2.

The second-first wiring line WL2-1, the second-second wiring line WL2-2, and the second connection wiring lines CWL2 may be integrally formed as one body. In addition, the second-first wiring line WL2-1, the second-second wiring line WL2-2, and the second connection wiring lines CWL2 may be components of the second gate layer described above. That is, the second-first wiring line WL2-1, the second-second wiring line WL2-2, and the second connection wiring lines CWL2 may be disposed on the second gate insulating layer 113. Accordingly, the second-first wiring line WL2-1, the second-second wiring line WL2-2, and the second connection wiring lines CWL2 may be formed of the same material as and simultaneously with the horizontal voltage line HL, the first initialization voltage line VL1, and the second initialization voltage line VL2, which are located in the central area CA. In addition, the second-first wiring line WL2-1, the second-second wiring line WL2-2, and the second connection wiring lines CWL2 may have the same layer structure as the horizontal voltage line HL, the first initialization voltage line VL1, and the second initialization voltage line VL2.

As shown in FIG. 9, a fourth connection wiring line CWL4, which connects an end of the second-first wiring line WL2-1 in a direction (a −EDR direction) of the first wiring line WL1 to an end of the second-second wiring line WL2-2 in the direction (the −EDR direction) of the first wiring line WL1, may be further provided. The second-first wiring line WL2-1, the second-second wiring line WL2-2, the second connection wiring lines CWL2, and the fourth connection wiring line CWL4 may be integrally formed as one body. In addition, the second-first wiring line WL2-1, the second-second wiring line WL2-2, the second connection wiring lines CWL2, and the fourth connection wiring line CWL4 may be components of the second gate layer described above. That is, the second-first wiring line WL2-1, the second-second wiring line WL2-2, the second connection wiring lines CWL2, and the fourth connection wiring line CWL4 may be disposed on the second gate insulating layer 113. Accordingly, the second-first wiring line WL2-1, the second-second wiring line WL2-2, the second connection wiring lines CWL2, and the fourth connection wiring line CWL4 may be formed of the same material as and simultaneously with the horizontal voltage line HL, the first initialization voltage line VL1, and the second initialization voltage line VL2, which are located in the central area CA. In addition, the second-first wiring line WL2-1, the second-second wiring line WL2-2, the second connection wiring lines CWL2, and the fourth connection wiring line CWL4 may have the same layer structure as the horizontal voltage line HL, the first initialization voltage line VL1, and the second initialization voltage line VL2.

The first-first connection wiring line CWL1-1 may electrically connect the second-first wiring line WL2-1 and the second-second wiring line WL2-2 to the first wiring line WL1. To this end, the first-first connection wiring line CWL1-1 may be connected to at least one of the second-first wiring line WL2-1 and the second-second wiring line WL2-2, and may be connected to a conductive layer connected to the second-first wiring line WL2-1 and/or the second-second wiring line WL2-2. FIG. 9 illustrates an example in which the first-first connection wiring line CWL1-1 is connected to the fourth connection wiring line CWL4 and electrically connected to the second-first wiring line WL2-1 and the second-second wiring line WL2-2.

The third connection wiring line CWL3 may electrically connect the plurality of second connection wiring lines CWL2 to each other in the extension area EA. To this end, the third connection wiring line CWL3 may have a shape extending in the extension direction EDR of the extension area EA.

The first-first connection wiring line CWL1-1 may be a component of the second source/drain layer described above. That is, the first-first connection wiring line CWL1-1 may be disposed on the first planarization layer 116. The first planarization layer 116 may have insulation characteristics. Accordingly, the first-first connection wiring line CWL1-1 may be formed of the same material as and simultaneously with the connection wiring line 1181 located in the central area CA, and the first-first connection wiring line CWL1-1 may have the same layer structure as the connection wiring line 1181.

The third connection wiring line CWL3 may be a component of the first source/drain layer described above. That is, the third connection wiring line CWL3 may be disposed on the interlayer-insulating layer 115. Accordingly, the third connection wiring line CWL3 may be formed of the same material as and simultaneously with the data line DL, the power supply voltage line PL, the first and second initialization connection lines 1173a and 1173b, the node connection line 1174, and the connection metal 1175, which are located in the central area CA. In addition, the third connection wiring line CWL3 may have the same layer structure as the data line DL, the power supply voltage line PL, the first and second initialization connection lines 1173a and 1173b, the node connection line 1174, and the connection metal 1175.

One end of the first-first connection wiring line CWL1-1 in a direction toward the central area CA may be connected to the first wiring line WL1 under the first-first connection wiring line CWL1-1 through a contact hole formed in the first planarization layer 116. The other end of the first-first connection wiring line CWL1-1 may be connected to the second-first wiring line WL2-1 and/or the second-second wiring line WL2-2 under the first-first connection wiring line CWL1-1 through a contact hole formed in the interlayer-insulating layer 115 and the first planarization layer 116, or may be connected to the fourth connection wiring line CWL4 under the first-first connection wiring line CWL1-1, as shown in FIG. 9. The third connection wiring line CWL3 may be connected to a plurality of second connection wiring lines CWL2 under the third connection wiring line CWL3 through contact holes formed in the interlayer-insulating layer 115.

In the case of the display device 1 according to the present embodiment, the driving voltage ELVDD transmitted through the first wiring line WL1 may be transmitted to pixel circuits PC1, PC2, PC3, and PC4 located in the extension area EA through the first-first connection wiring line CWL1-1, the second-first wiring line WL2-1, the second-second wiring line WL2-2, the plurality of second connection wiring lines CWL2, and the third connection wiring line CWL3, and, if necessary, through the fourth connection wiring line CWL4. In the extension area EA, the second-first wiring line WL2-1, the second-second wiring line WL2-2, the plurality of second connection wiring lines CWL2, and the third connection wiring line CWL3, which are electrically connected to each other, may form a grid-shaped conductive network. Therefore, a voltage drop of the driving voltage ELVDD in the extension area EA may be effectively prevented or reduced, and accordingly, a high-quality image may be displayed in the corner area CNA including the central corner area CCA.

For reference, FIG. 9 illustrates an example in which four pixel circuits PC1, PC2, PC3, and PC4 are located in the extension area EA and display elements DPE1, DPE2, DPE3, and DPE4 are located above the pixel circuits PC1, PC2, PC3, and PC4. However, the disclosure is not limited thereto, and the number of pixel circuits located in the extension area EA and the number of display elements located in the extension area EA may vary. In addition, each of the display elements DPE1, DPE2, DPE3, and DPE4 may include a red display element DPEr, a green display element DPEg, and a blue display element DPEb. In this case, each of the pixel circuits PC1, PC2, PC3, and PC4 may also include a pixel circuit electrically connected to the red display element DPEr, a pixel circuit electrically connected to the green display element DPEg, and a pixel circuit electrically connected to the blue display element DPEb.

Figure 10:
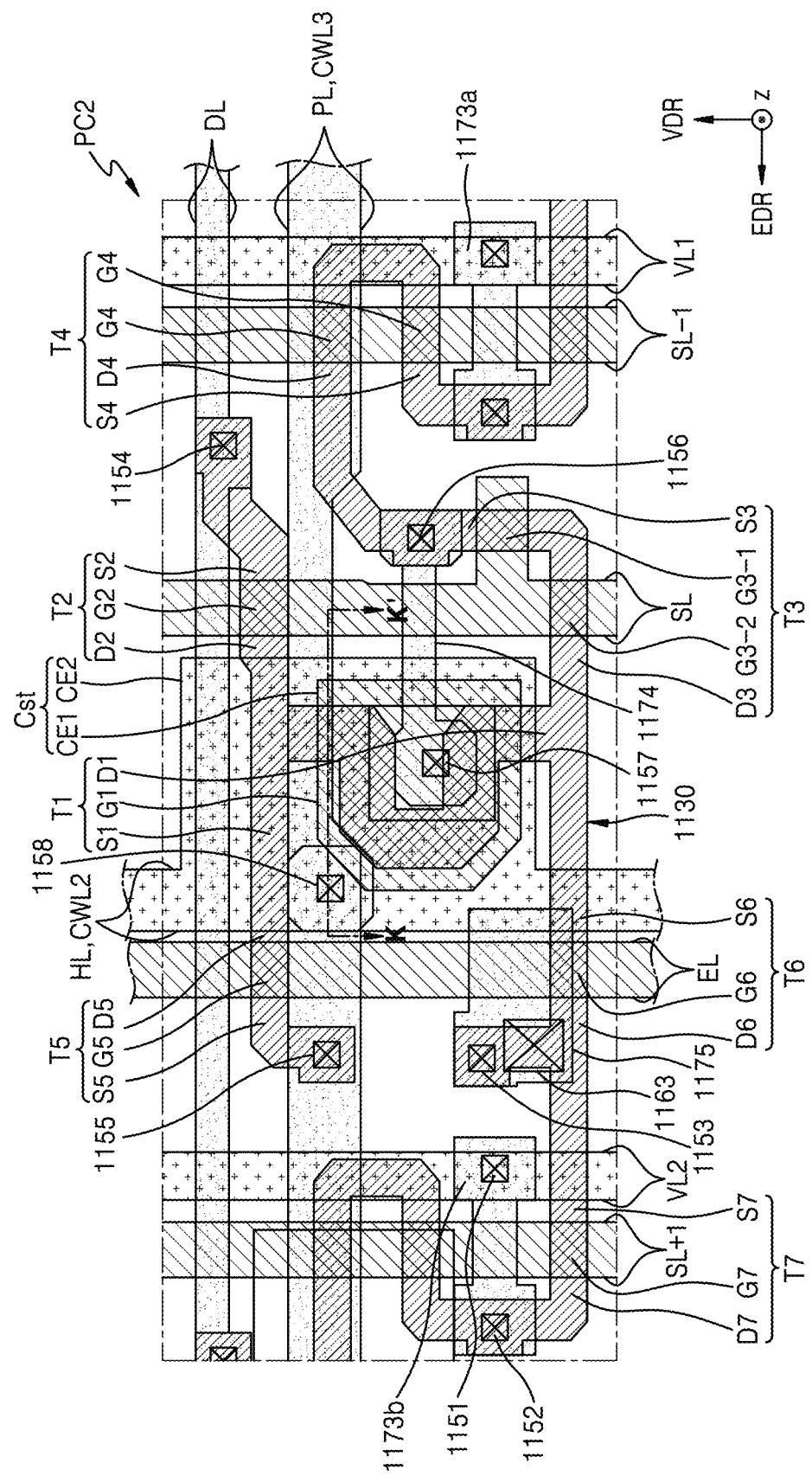
FIG. 10 is a schematic layout illustrating an example of a pixel circuit located in an extension area of FIG. 9.
Figure 11:
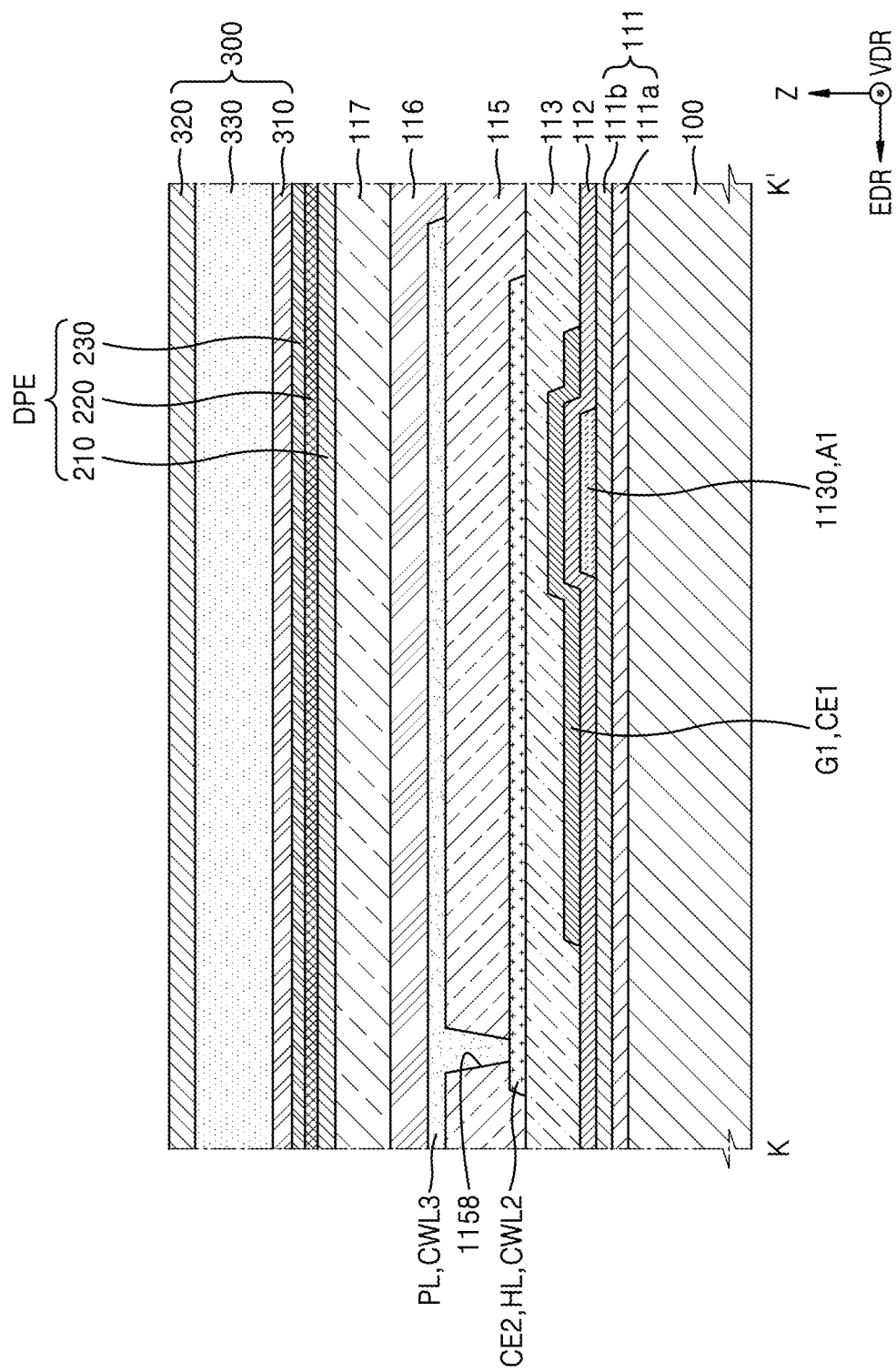
FIG. 11 is a schematic cross-sectional view illustrating a cross-section of the display device taken along line K-K' in FIG. 10.

FIG. 10 is a schematic layout illustrating an example of a pixel circuit PC2 located in the extension area EA of FIG. 9, and FIG. 11 is a schematic cross-sectional view illustrating a cross-section taken of the display device 1 along line K-K' in FIG. 10. The pixel circuit PC2 is electrically connected to a display element DPE2 located above the pixel circuit PC2, and thus, when the display element DPE2 includes a red display element DPEr, a green display element DPEg, and a blue display element DPEb, the pixel circuit PC2 may also include one of three pixel circuits, such as a pixel circuit electrically connected to the red display element DPEr, a pixel circuit electrically connected to the green display element DPEg, and a pixel circuit electrically connected to the blue display element DPEb. For convenience, a case in which the pixel circuit PC2 includes one pixel circuit is illustrated in FIG. 10.

The pixel circuit PC2 may have the same configuration as the pixel circuit PC disposed in the central area CA of the display panel 10, described with reference to FIG. 5. However, although the pixel circuit PC of FIG. 5 has a power supply voltage line PL and the like extending in the second direction (the y direction or the −y direction), the pixel circuit PC2 of FIG. 10 may have a power supply voltage line PL and the like extending in the extension direction EDR of the extension area EA. The power supply voltage line PL extending in the extension direction EDR may function as the third connection wiring line CWL3 described above with reference to FIG. 9.

Similarly, although the pixel circuit PC of FIG. 5 has a horizontal voltage line HL and the like extending in the first direction (the x direction or the −x direction), the pixel circuit PC2 of FIG. 10 may have a horizontal voltage line HL and the like extending in a vertical direction VDR perpendicular to the extension direction EDR of the extension area EA. The horizontal voltage line HL extending in the vertical direction VDR may function as the second connection wiring line CWL2 described above with reference to FIG. 9. The third connection wiring line CWL3 may be connected to the second connection wiring line CWL2 under the interlayer-insulating layer 115 through a contact hole 1158 formed in the interlayer-insulating layer 115 under the third connection wiring line CWL3.

As described above, in the extension area EA, the second-first wiring line WL2-1, the second-second wiring line WL2-2, the plurality of second connection wiring lines CWL2, and the third connection wiring line CWL3, which are electrically connected to each other, may form a grid-shaped conductive network. Accordingly, a voltage drop of the driving voltage ELVDD transmitted from the first wiring line WL1 may be effectively prevented or reduced from occurring in the extension area EA. The driving voltage ELVDD transmitted from the first wiring line WL1 may be applied to a driving thin-film transistor T1 in the pixel circuit PC2.

Referring back to FIG. 8, the driving circuit DC may be disposed in the intermediate area MA. The driving circuit DC may be a scan driving circuit that provides a scan signal, through the scan line SL, to pixel circuits electrically connected to sub-pixels in the pixel PX. Alternatively, the driving circuit DC may be an emission control driving circuit that provides an emission control signal, through an emission control line (not shown), to the pixel circuits electrically connected to the sub-pixels. The driving circuit DC may be arranged in an extension direction of the intermediate area MA. The driving circuit DC may be arranged to surround at least a part of the central area CA, the first area A1, and the second area A2. The driving circuit DC may supply a scan signal to a scan line SL and supply a previous scan signal to a previous scan line. Alternatively, the driving circuit DC may supply an emission control signal to an emission control line.

The driving circuit DC may include a first driving circuit DC1 and a second driving circuit DC2, as shown in FIG. 9. In this case, one of the first driving circuit DC1 and the second driving circuit DC2 may supply a scan signal or a previous scan signal to a scan line or a previous scan line. The other one of the first driving circuit DC1 and the second driving circuit DC2 may supply an emission control signal to an emission control line.

Pixel circuits PC5, PC6, PC7, and PC8 may be located in the intermediate area MA so as to be located between the driving circuit DC and the first wiring line WL1. Display elements DPE7 and DPE8 electrically connected to the pixel circuits PC7 and PC8 may be located above the pixel circuits PC7 and PC8, respectively. Display elements DPE5 and DPE6 electrically connected to the pixel circuits PC5 and PC6 may not be located above the pixel circuits PC5 and PC6. The display elements DPE5 and DPE6 may be located above the driving circuit DC to overlap the driving circuit DC in a plan view. That is, each of the display elements DPE5 and DPE6 may be located farther from the first wiring line WL1 than each of the pixel circuits PC5 and PC6.

Although FIG. 9 illustrates an example in which the display elements DPE5 and DPE6 are located between the first driving circuit DC1 and the second driving circuit DC2 for convenience of illustration, the disclosure is not limited thereto. In another embodiment, for example, the display elements DPE5 and DPE6 may overlap the first driving circuit DC1 or overlap the second driving circuit DC2 in a plan view. The display elements DPE5 and DPE6 may be electrically connected to the pixel circuits PC5 and PC6, respectively, by pixel connection wiring lines (not shown) disposed on the first planarization layer 116. The pixel connection wiring lines may be components of the second source/drain layer. Accordingly, the pixel connection wiring lines may be formed of the same material as and simultaneously with the first-first connection wiring line CWL1-1 and the connection wiring line 1181 located in the central area CA. In addition, the pixel connection wiring lines may have the same layer structure as the first-first connection wiring line CWL1-1 and the connection wiring line 1181.

By having such a configuration, the display device 1 according to the present embodiment may allow an image to be displayed even where there is the driving circuit DC, thereby dramatically increasing an area in which an image is displayed in the display panel 10.

As shown in FIG. 9, a plurality of second wiring lines WL2 and a plurality of additional wiring lines AWL may be located in the intermediate area MA. Each of the plurality of second wiring lines WL2 may be located between the first wiring line WL1 and the extension area EA, ends of the second wiring lines WL2 in a direction toward the central area CA may be connected to the first wiring line WL1, and the second wiring lines WL2 may extend from the first wiring line WL1 in the extension direction EDR, which is a direction toward the extension area EA. The plurality of additional wiring lines AWL may electrically connect the plurality of second wiring lines WL2 to each other. Accordingly, each of the plurality of additional wiring lines AWL may extend in a direction crossing the extension direction EDR of the extension area EA, for example, in a vertical direction VDR.

The second wiring lines WL2 may be components of the second gate layer described above. That is, the second wiring lines WL2 may be disposed on the second gate insulating layer 113. Accordingly, the second wiring lines WL2 may be formed of the same material as and simultaneously with the second-first wiring line WL2-1, the second-second wiring line WL2-2, and the second connection wiring lines CWL2, which are located in the extension area EA, and the horizontal voltage line HL, the first initialization voltage line VL1, and the second initialization voltage line VL2, which are located in the central area CA. In addition, the second wiring lines WL2 may have the same layer structure as the second-first wiring line WL2-1, the second-second wiring line WL2-2, and the second connection wiring lines CWL2, which are located in the extension area EA, and the horizontal voltage line HL, the first initialization voltage line VL1, and the second initialization voltage line VL2, which are located in the central area CA.

The additional wiring lines AWL may be components of the first source/drain layer described above. That is, the additional wiring lines AWL may be disposed on the interlayer-insulating layer 115. Accordingly, the additional wiring lines AWL may be formed of the same material as and simultaneously with the third connection wiring line CWL3 in the extension area EA, and the data line DL, the power supply voltage line PL, the first and second initialization connection lines 1173a and 1173b, the node connection line 1174, and the connection metal 1175, which are located in the central area CA. In addition, the additional wiring lines AWL may have the same layer structure as the third connection wiring line CWL3 in the extension area EA, and the data line DL, the power supply voltage line PL, the first and second initialization connection lines 1173a and 1173b, the node connection line 1174, and the connection metal 1175, which are located in the central area CA.

The first wiring line WL1 disposed on the interlayer-insulating layer 115 may be connected to the second wiring lines WL2 located under the interlayer-insulating layer 115 through contact holes formed in the interlayer-insulating layer 115. Similarly, the additional wiring lines AWL disposed on the interlayer-insulating layer 115 may be connected to the second wiring lines WL2 located under the interlayer-insulating layer 115 through contact holes formed in the interlayer-insulating layer 115.

In the case of the display device 1 according to the present embodiment, the driving voltage ELVDD transmitted through the first wiring line WL1 may be transmitted through the second wiring lines WL2 and the additional wiring line AWL to the pixel circuits PC5, PC6, PC7, and PC8 located in the intermediate area MA. In the intermediate area MA, the second wiring lines WL2 and the additional wiring lines AWL, which are electrically connected to each other, may form a grid-shaped conductive network. Accordingly, a voltage drop of the driving voltage ELVDD in the intermediate area MA may be effectively prevented or reduced, and accordingly, a high-quality image may be displayed in the intermediate area MA.

Although FIG. 9 illustrates only four pixel circuits PC5, PC6, PC7, and PC8 in the intermediate area MA for convenience, the disclosure is not limited thereto. Accordingly, in the plurality of pixel circuits located in the intermediate area MA, a grid-shaped conductive network may be formed through the plurality of second wiring lines WL2 and the plurality of additional wiring lines AWL.

Each of the display elements DPE5, DPE6, DPE7, and DPE8 located in the intermediate area MA may include a red display element DPEr, a green display element DPEg, and a blue display element DPEb. In this case, each of the pixel circuits PC5, PC6, PC7, and PC8 may also include a pixel circuit electrically connected to the red display element DPEr, a pixel circuit electrically connected to the green display element DPEg, and a pixel circuit electrically connected to the blue display element DPEb.

Figure 12:
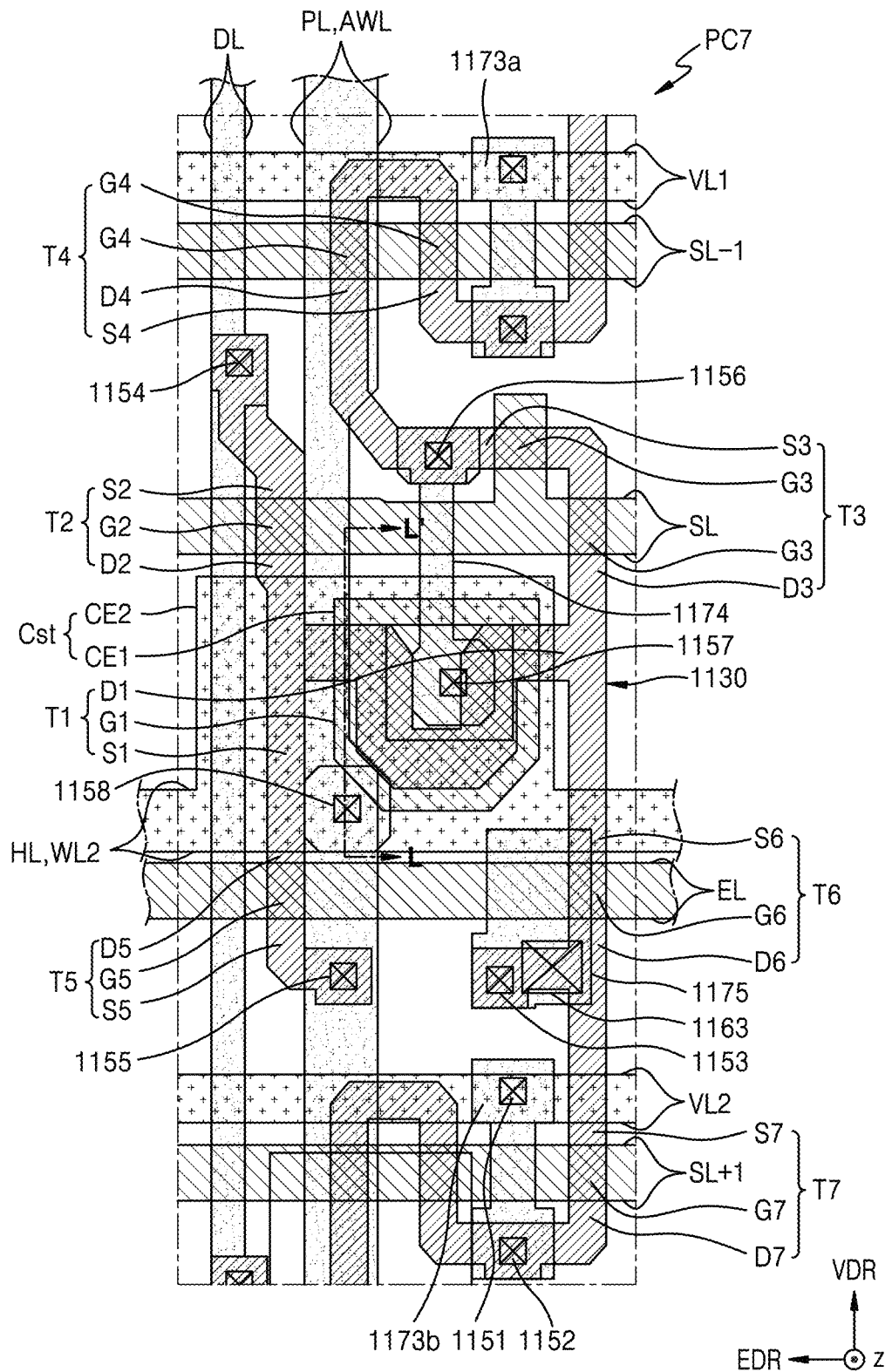
FIG. 12 is a schematic layout illustrating an example of a pixel circuit located in an intermediate area of FIG. 9.
Figure 13:
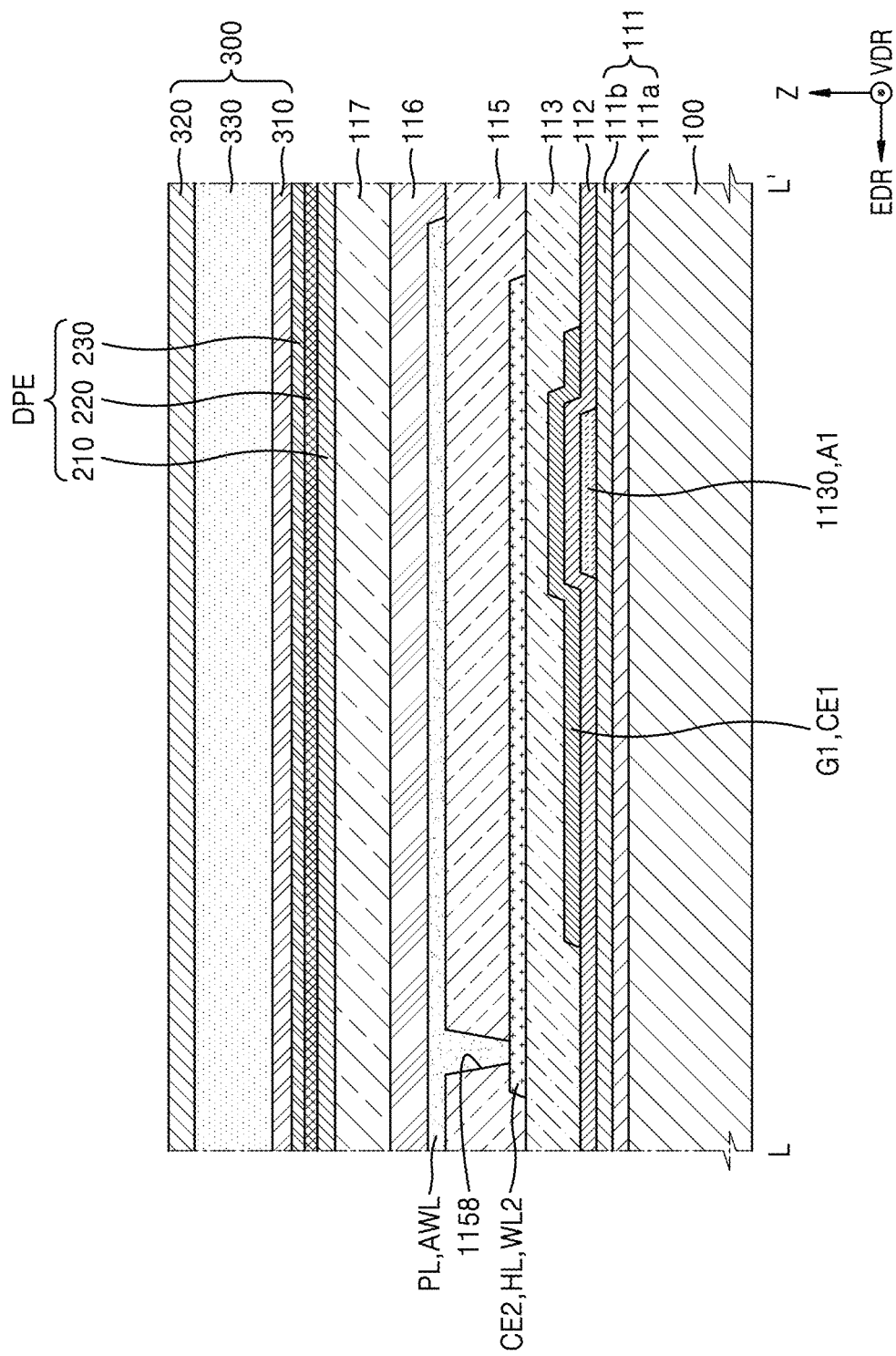
FIG. 13 is a schematic cross-sectional view illustrating a cross-section of the display device taken along line L-L' in FIG. 12.

FIG. 12 is a schematic layout illustrating an example of a pixel circuit PC7 located in the intermediate area EA of FIG. 9, and FIG. 13 is a schematic cross-sectional view illustrating a cross-section of the display device taken along line L-L' in FIG. 12. The pixel circuit PC7 is electrically connected to a display element DPE7 located above the pixel circuit PC7, and thus, when the display element DPE7 includes a red display element DPEr, a green display element DPEg, and a blue display element DPEb, the pixel circuit PC7 may also include any one of three pixel circuits, such as a pixel circuit electrically connected to the red display element DPEr, a pixel circuit electrically connected to the green display element DPEg, and a pixel circuit electrically connected to the blue display element DPEb. For convenience, FIG. 12 illustrates a case in which the pixel circuit PC7 includes one pixel circuit.

The pixel circuit PC7 may have the same configuration as the pixel circuit PC disposed in the central area CA of the display panel 10, described with reference to FIG. 5. However, although the pixel circuit PC of FIG. 5 has a power supply voltage line PL and the like extending in the second direction (the y-direction or the −y-direction), the pixel circuit PC7 of FIG. 12 may have a power supply voltage line PL and the like extending in the vertical direction VDR perpendicular to the extension direction EDR of the extension area EA. The power supply voltage line PL extending in the vertical direction VDR may function as the additional wiring line AWL described above with reference to FIG. 9.

Similarly, although the pixel circuit PC of FIG. 5 has a horizontal voltage line HL and the like extending in the first direction (the x direction or the −x direction), the pixel circuit PC7 of FIG. 12 may have a horizontal voltage line HL and the like extending in the extension direction EDR of the extension area EA. The horizontal voltage line HL extending in the extension direction EDR may function as the second wiring line WL2 described above with reference to FIG. 9. The additional wiring line AWL may be connected to the second wiring line WL2 under the interlayer-insulating layer 115 through a contact hole 1158 formed in the interlayer-insulating layer 115 under the additional wiring line AWL.

As described above, in the intermediate area MA, the second wiring lines WL2 and the additional wiring lines AWL, which are electrically connected to each other, may form a grid-shaped conductive network. Accordingly, a voltage drop of the driving voltage ELVDD transmitted from the first wiring line WL1 may be effectively prevented or reduced from occurring in the intermediate area MA. The driving voltage ELVDD transmitted from the first wiring line WL1 may be applied to a driving thin-film transistor T1 in the pixel circuit PC7.

The pixel circuit PC2 located in the extension area EA of FIG. 9 has been described with reference to FIGS. 10 and 11. Hereinafter, a structure of a region near the separation area SA in the extension area EA will be described with reference to FIG. 14 that is a schematic cross-sectional view illustrating a cross-section taken along line J-J' in FIG. 9. Among reference numerals shown in FIG. 14, reference numerals that are the same as those shown in FIG. 11 denote members that are the same as or correspond to those in FIG. 11, and thus, descriptions thereof will be omitted for convenience. For reference, a pixel circuit PC3 is illustrated in FIG. 14, but the pixel circuit PC3 may have a structure that is different from that illustrated in FIG. 14.

Figure 14:
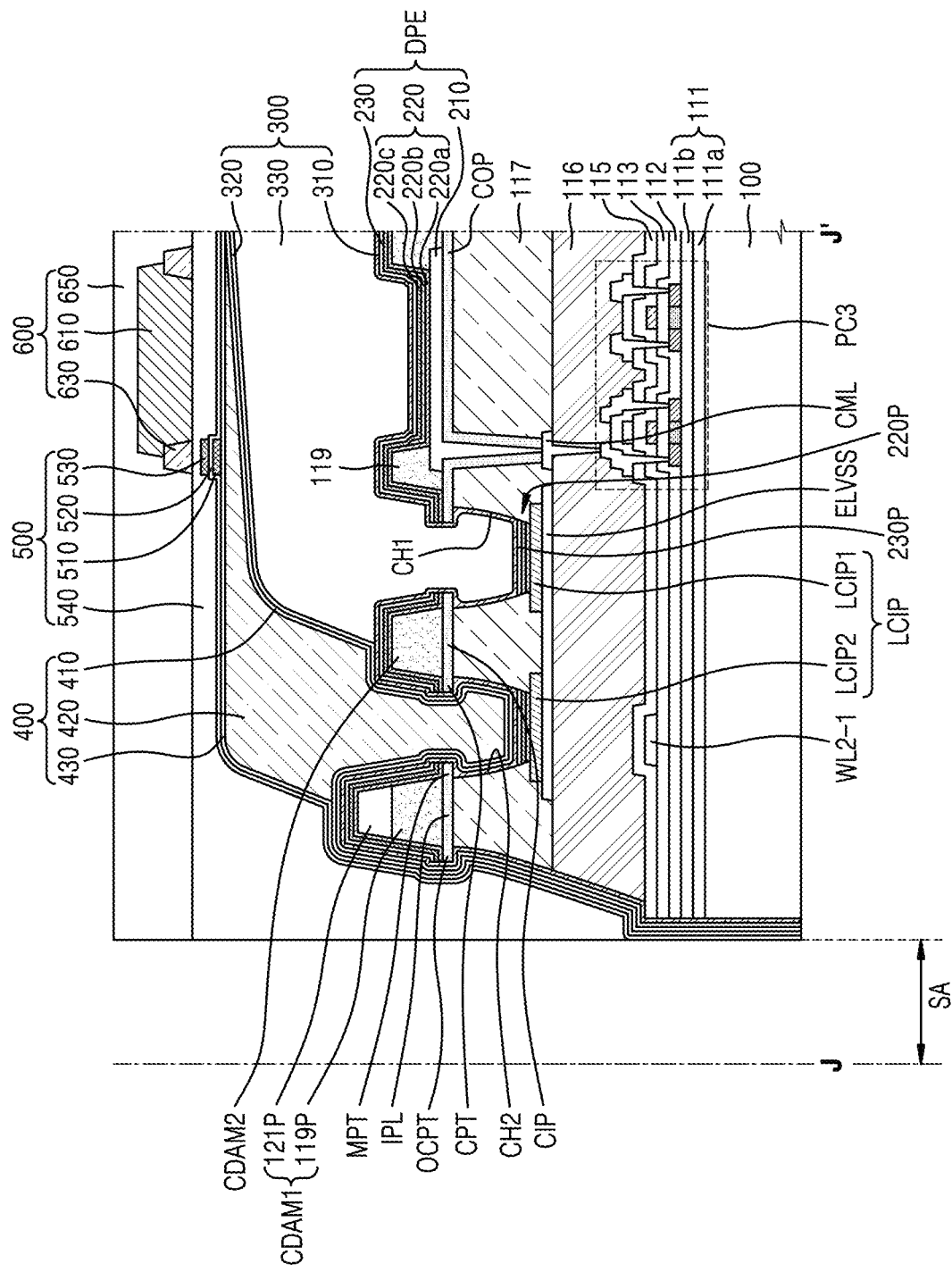
FIG. 14 is a schematic cross-sectional view illustrating a cross-section of the display device taken along line J-J' in FIG. 9.

As shown in FIG. 14, the second-first wiring line WL2-1 may be disposed on the second gate insulating layer 113, and the interlayer-insulating layer 115 may cover the second-first wiring line WL2-1. A connection electrode CML may be disposed on the first planarization layer 116 covering the interlayer-insulating layer 115. The connection electrode CML may be disposed on the same layer as the connection wiring line 1181 described above with reference to FIG. 7 and may be formed of the same material as and simultaneously with the connection wiring line 1181. The connection electrode CML may electrically connect the pixel circuit PC3 located below the connection electrode CML to the pixel electrode 210 located above the connection electrode CML.

An electrode power supply line ELVSS may be disposed on the first planarization layer 116 like the connection electrode CML, and may be formed of the same material as and simultaneously with the connection electrode CML. The electrode power supply line ELVSS may be electrically connected to the common electrode 230 in the organic light-emitting diode, which is the display element DPE, to apply an electrical signal to the common electrode 230.

The second planarization layer 117 may cover the electrode power supply line ELVSS and the connection electrode CML, and as shown in FIG. 14, the second planarization layer 117 may have a first corner hole CH1 and a second corner hole CH2. The second planarization layer 117 may have a contact hole, and thus, the pixel electrode 210 disposed on the second planarization layer 117 may be connected to the connection electrode CML through the contact hole. The first corner hole CH1, the second corner hole CH2, and the contact hole may be simultaneously formed.

The first corner hole CH1 and the second corner hole CH2 may overlap the electrode power supply line ELVSS in a plan view, and a lower corner inorganic pattern LCIP disposed on the electrode power supply line ELVSS may prevent or reduce damage to the electrode power supply line ELVSS in the process of forming the first corner hole CH1 and the second corner hole CH2. Specifically, the lower corner inorganic pattern LCIP may include a first lower corner inorganic pattern LCIP1 and a second lower corner inorganic pattern LCIP2, and the first lower corner inorganic pattern LCIP1 may overlap the first corner hole CH1 and the second lower corner inorganic pattern LCIP2 may overlap the second corner hole CH2 in a plan view. Accordingly, in the process of forming the first corner hole CH1 and the second corner hole CH2, the electrode power supply line ELVSS may not be exposed or the degree of exposure may be reduced, and thus, damage to the electrode power supply line ELVSS may be prevented or reduced. The lower corner inorganic pattern LCIP may include $SiO_2$, SiNx, SiON, $Al_2O_3$, $TiO_2$, $Ta_2O_5$, $HfO_2$, ZnO or $ZnO_2$, or the like.

An overlapping inorganic pattern COP, a corner inorganic pattern CIP, and an inorganic pattern line IPL may be disposed on the second planarization layer 117. The overlapping inorganic pattern COP, the corner inorganic pattern CIP, and the inorganic pattern line IPL may be simultaneously formed of the same material. The overlapping inorganic pattern COP, the corner inorganic pattern CIP, and the inorganic pattern line IPL may each include $SiO_2$, SiNx, SiON, $Al_2O_3$, $TiO_2$, $Ta_2O_5$, $HfO_2$, ZnO or $ZnO_2$, or the like.

The overlapping inorganic pattern COP may be disposed on the second planarization layer 117 and may be located near a contact hole. As shown in FIG. 14, the overlapping inorganic pattern COP may also be disposed on the inner surface of the contact hole. In this case, the pixel electrode 210 disposed on the second planarization layer 117 may be disposed on the overlapping inorganic pattern COP and connected to the connection electrode CML through a contact hole. For reference, the overlapping inorganic pattern COP is omitted in FIGS. 11 and 13 for convenience.

The corner inorganic pattern CIP may be apart from the overlapping inorganic pattern COP by the first corner hole CH1, and may have a shape in which the corner inorganic pattern CIP surrounds at least a part of the overlapping inorganic pattern COP in a plan view. The inorganic pattern line IPL may be apart from the corner inorganic pattern CIP by the second corner hole CH2, and may have a shape in which the inorganic pattern line IPL surrounds at least a part of the corner inorganic pattern CIP in a plan view.

The corner inorganic pattern CIP may have a corner protruding tip CPT protruding toward the center of at least one of the first corner hole CH1 and the second corner hole CH2. In FIG. 14, the corner inorganic pattern CIP is illustrated to protrude toward the center of each of the first corner hole CH1 and the second corner hole CH2. The inorganic pattern line IPL may have an intermediate protruding tip MPT protruding toward the center of the second corner hole CH2. In addition, the inorganic pattern line IPL may have an outer corner protruding tip OCPT protruding toward the separation area SA. As shown in FIG. 14, the overlapping inorganic pattern COP may also have a protruding tip protruding toward the center of the first corner hole CH1.

The pixel-defining layer 119 may cover the edge of the pixel electrode 210. In this case, when the pixel-defining layer 119 is formed, a first pattern 119P may be formed of the same material as and simultaneously with the pixel-defining layer 119. The first pattern 119P may be disposed on the inorganic pattern line IPL. The first pattern 119P may form a first corner dam CDAM1 together with the inorganic pattern line IPL. When a spacer (not shown) is formed on the pixel-defining layer 119, a second pattern 121P disposed on the first pattern 119P may be formed of the same material as and simultaneously with the spacer. In this case, the first pattern 119P and the second pattern 121P may form the first corner dam CDAM1 together with the inorganic pattern line IPL. In addition, when the pixel-defining layer 119 is formed, a second corner dam CDAM2, which is apart from the first corner dam CDAM1 and disposed on the corner inorganic pattern CIP, may be formed of the same material as and simultaneously with the pixel-defining layer 119.

The intermediate layer 220 may be disposed on the pixel-defining layer 119. The intermediate layer 220 may include an emission layer 220b disposed in an opening of the pixel-defining layer 119 and overlapping the pixel electrode 210 in a plan view. The intermediate layer 220 may further include at least one of a first functional layer 220a located between the pixel electrode 210 and the emission layer 220b and a second functional layer 220c disposed on the emission layer 220b. For example, the first functional layer 220a may include an HTL or include an HTL and an HIL. The second functional layer 220c may include an ETL and/or an EIL. The first functional layer 220a and the second functional layer 220c may each be integrally formed as one body to correspond to the plurality of pixel electrodes 210.

As described above, the overlapping inorganic pattern COP may have a protruding tip protruding toward the center of the first corner hole CH1. In addition, the corner inorganic pattern CIP may have a corner protruding tip CPT protruding toward the center of the first corner hole CH1. Accordingly, when the first functional layer 220a and the second functional layer 220c are formed, a functional layer pattern 220P, which is separated from the first functional layer 220a and the second functional layer 220c by the protruding tip of the overlapping inorganic pattern COP and the corner protruding tip CPT of the corner inorganic pattern CIP and is located in the first corner hole CH1, may be formed. In addition, as described above, the inorganic pattern line IPL may have an intermediate protruding tip MPT protruding toward the center of the second corner hole CH2. Accordingly, when the first functional layer 220a and the second functional layer 220c are formed, the functional layer pattern 220P located in the second corner hole CH2 by the corner protruding tip CPT and the intermediate protruding tip MPT may be formed.

The common electrode 230 may be formed on the pixel-defining layer 119 and the intermediate layer 220 to correspond to the plurality of pixel electrodes 210. Therefore, for the same reason as the functional layer pattern 220P located in the first corner hole CH1 and the second corner hole CH2 is formed, a common electrode pattern 230P located in the first corner hole CH1 and the second corner hole CH2 may be formed.

The first inorganic encapsulation layer 310 in the encapsulation layer 300 may be disposed on the common electrode 230 and may be in direct contact with the protruding tip of the overlapping inorganic pattern COP, the corner protruding tip CPT of the corner inorganic pattern CIP, and the intermediate protruding tip MPT of the inorganic pattern line IPL. Furthermore, in some cases, as shown in FIG. 14, the first inorganic encapsulation layer 310 may be in contact with the common electrode pattern 230P in the first corner hole CH1 and the second corner hole CH2, and may cover the inner surfaces of the first corner hole CH1 and the second corner hole CH2. The organic encapsulation layer 330 in the encapsulation layer 300 may be disposed on the first inorganic encapsulation layer 310, and may fill the first corner hole CH1, as shown in FIG. 14. The second corner dam CDAM2 may prevent a material for forming the organic encapsulation layer 330 from flowing out during a manufacturing process. The second inorganic encapsulation layer 320 in the encapsulation layer 300 may be disposed on the organic encapsulation layer 330. The second inorganic encapsulation layer 320 may be in direct contact with the first inorganic encapsulation layer 310 on the second corner dam CDAM2. In an embodiment, the second inorganic encapsulation layer 320 may be in direct contact with the first inorganic encapsulation layer 310 even in the second corner hole CH2.

The display device 1 according to the present embodiment may include a protective layer 400, a touch sensor layer 500, and an anti-reflection layer 600, as shown in FIG. 14.

The protective layer 400 may be disposed on the encapsulation layer 300. The protective layer 400 may protect the encapsulation layer 300. The protective layer 400 may include a first inorganic protective layer 410, an organic protective layer 420, and a second inorganic protective layer 430. The first inorganic protective layer 410 and the second inorganic protective layer 430 may each include $SiO_2$, SiNx, SiON, $Al_2O_3$, $TiO_2$, $Ta_2O_5$, $HfO_2$, ZnO or $ZnO_2$, or the like. The organic protective layer 420 may include polyethylene terephthalate, polyethylene naphthalate, polycarbonate, polyimide, polyethylene sulfonate, polyoxymethylene, polyarylate, hexamethyldisiloxane, acrylic resin (e.g., polymethyl methacrylate or polyacrylic acid), or any combination thereof.

The first inorganic protective layer 410 may be disposed on the encapsulation layer 300, and the organic protective layer 420 may be disposed on the first inorganic protective layer 410. In addition, the second inorganic protective layer 430 may be disposed on the organic protective layer 420. The organic protective layer 420 may fill the second corner hole CH2. The second inorganic protective layer 430 may be in direct contact with the first inorganic protective layer 410 on the first corner dam CDAM1. The first inorganic protective layer 410 and the second inorganic protective layer 430 may surround the corner protruding tip CPT of the corner inorganic pattern CIP. In addition, the first inorganic protective layer 410 and the second inorganic protective layer 430 may surround the outer corner protruding tip OCPT of the inorganic pattern line IPL. Accordingly, damage to the display device 1 by external oxygen, moisture, or the like may be effectively prevented, and mechanical strength of the display device 1 may be increased, thereby preventing damage from external impact.

The touch sensor layer 500 may be disposed on the protective layer 400. The touch sensor layer 500 may include a first touch conductive layer 510, a first touch insulating layer 520, a second touch conductive layer 530, and a second touch insulating layer 540. In an embodiment, the second touch insulating layer 540 may overlap the outer corner protruding tip OCPT of the inorganic pattern line IPL in a plan view.

The anti-reflection layer 600 may be disposed on the touch sensor layer 500. The anti-reflection layer 600 may include, for example, a color filter 610, a black matrix 630, and a planarization layer 650. The color filter 610 may overlap the pixel electrode 210 in a plan view.

Figure 15:
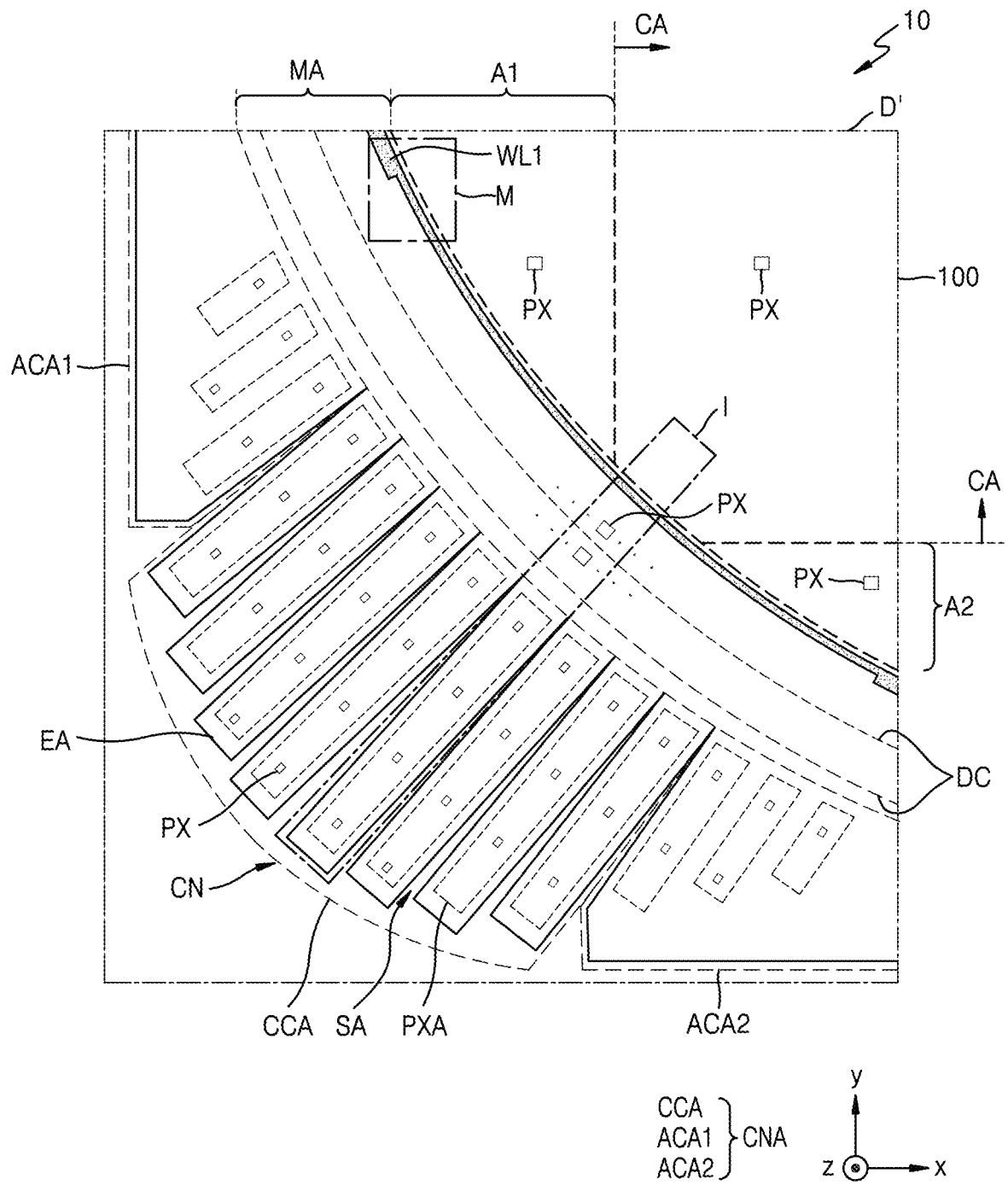
FIG. 15 is a conceptual view illustrating a portion of a display device according to an embodiment.
Figure 16:
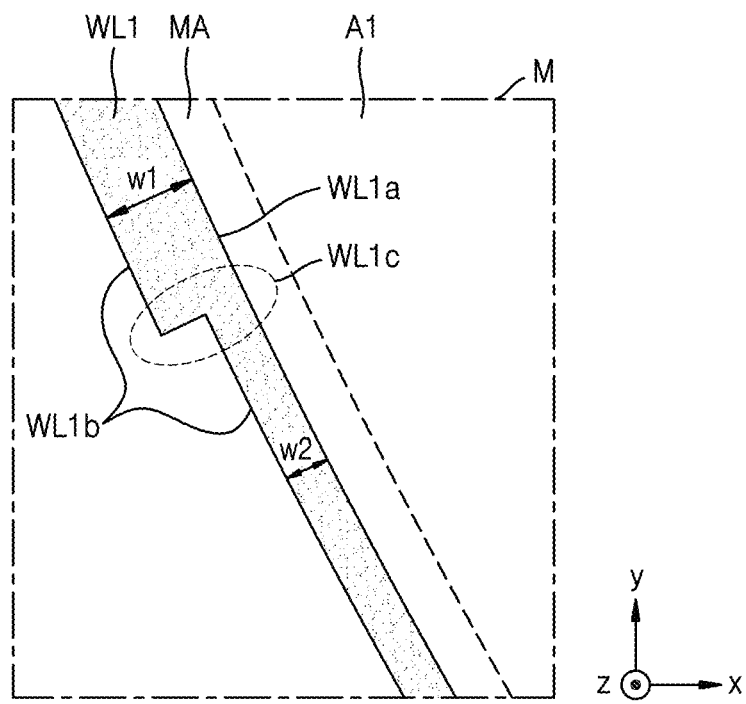
FIG. 16 is an enlarged conceptual view illustrating a region M of FIG. 15.

FIG. 15 is a conceptual view illustrating a portion of a display device 1 according to an embodiment, and FIG. 16 is an enlarged conceptual view illustrating a region M of FIG. 15. In FIG. 15, unlike in FIG. 8, a first wiring line WL1 is illustrated.

The first wiring line WL1 disposed in an intermediate area MA may extend along the outside of a first area A1, as shown in FIG. 15. In addition, the first wiring line WL1 in the intermediate area MA may have a width-varying portion WL1c outside the first area A1. Specifically, a width w1 of a portion of the first wiring line WL1, which extends further from a central corner area CCA than the width-varying portion WL1c, may be greater than a width w2 of a portion of the first wiring line WL1, which is closer to the central corner area CCA than the width-varying portion WL1c. To this end, an edge WL1b of the first wiring line WL1 away from the central area CA may have a stepped portion forming the width-varying portion WL1c. On the other hand, an edge WL1a of the first wiring line WL1 in the direction toward the central area CA may not have a stepped portion, and thus may have a smooth shape.

As such, by reducing the width w2 of the portion of the first wiring line WL1 close to the central corner area CCA, a space in which the pixel circuits PC5, PC6, PC7, and PC8 may be located in the vicinity of the central corner area CCA may be secured more widely. Accordingly, the resolution in the vicinity of the central corner area CCA of the intermediate area MA may be sufficiently increased.

However, when the width w2 of the portion of the first wiring line WL1 close to the central corner area CCA is reduced, a voltage drop of the driving voltage ELVDD may occur in the first wiring line WL1. However, as described above, second wiring lines WL2 and additional wiring lines AWL, electrically connected to each other in the intermediate area MA, may form a grid-shaped conductive network. In addition, the grid-shaped conductive network may be located near the portion of the first wiring line WL1 having the width w2 that is relatively small, and electrically connected to the first wiring line WL1. Accordingly, even when the width w2 of the portion of the first wiring line WL1 close to the central corner area CCA is reduced, a voltage drop of the driving voltage ELVDD may be effectively prevented or reduced.

Figure 17:
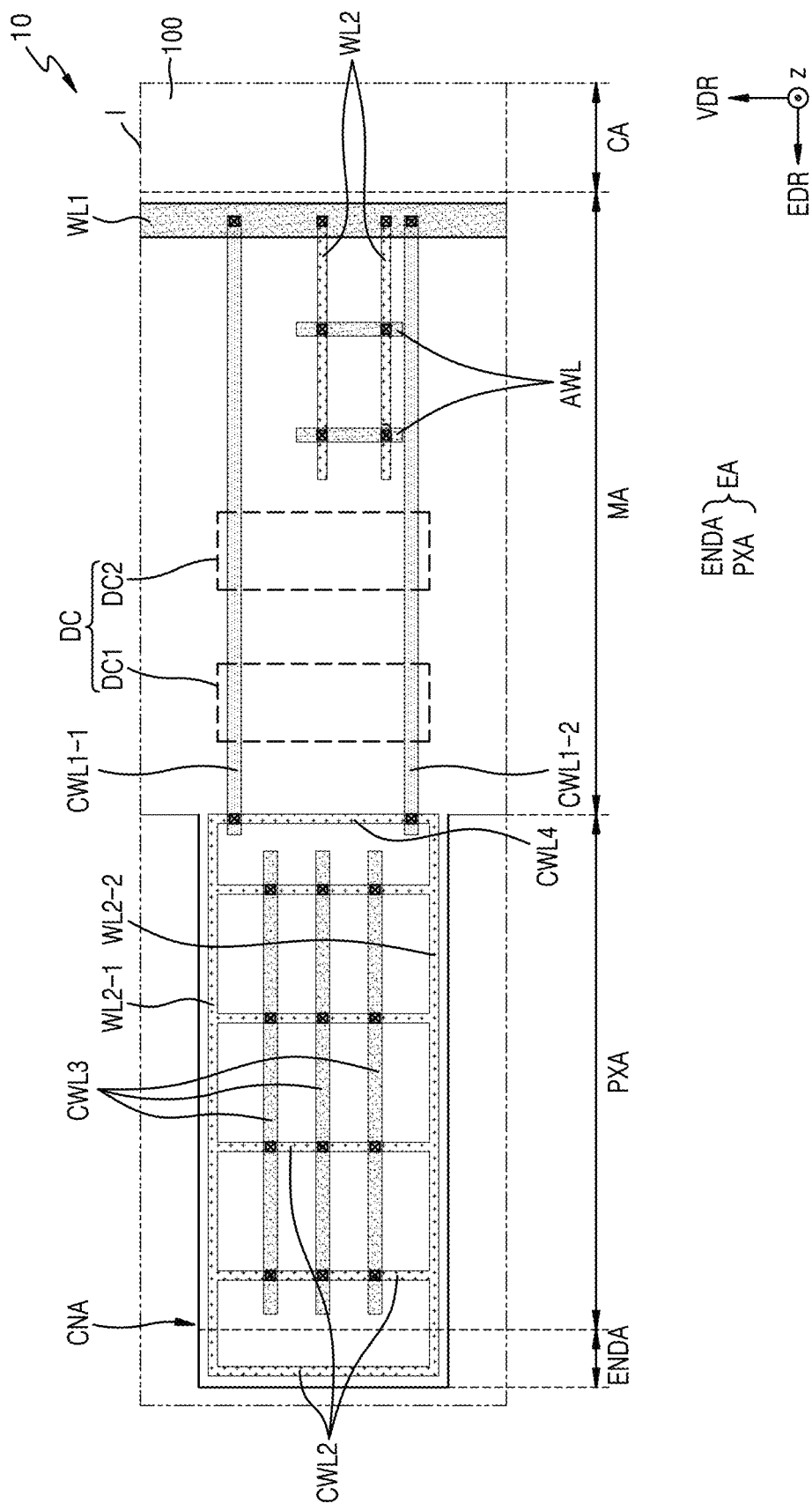
FIG. 17 is a conceptual view illustrating a portion of a display device according to another embodiment.

FIG. 17 is a conceptual view illustrating a portion of a display device 1 according to another embodiment. As shown in FIG. 17, a display panel 10 may include a first-second connection wiring line CWL1-2 in addition to a first-first connection wiring line CWL1-1. The first-second connection wiring line CWL1-2 may connect a second-first wiring line WL2-1 and a second-second wiring line WL2-2 to a first wiring line WL1, like the first-first connection wiring line CWL1-1. To this end, the first-second connection wiring line CWL1-2 may be connected to at least one of the second-first wiring line WL2-1 and the second-second wiring line WL2-2, and may be connected to a conductive layer connected to the second-first wiring line WL2-1 and/or the second-second wiring line WL2-2. FIG. 17 illustrates an example in which the first-second connection wiring line CWL1-2 is connected to a fourth connection wiring line CWL4 and electrically connected to the second-first wiring line WL2-1 and the second-second wiring line WL2-2.

According to the embodiments of the disclosure made as described above, a display device capable of displaying a high-quality image may be implemented. Obviously, the scope of the disclosure is not limited by the effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate including a central area, a corner area including an extension area extending in a direction away from the central area, and an intermediate area between the central area and the corner area, wherein the direction away from the central area is an extension direction of the extension area;
a first wiring line disposed in the intermediate area;
a second-first wiring line extending along one of opposite edges of the extension area extending in the extension direction;
a second-second wiring line extending along another of the opposite edges of the extension area extending in the extension direction;
a first-first connection wiring line, which electrically connects the second-first wiring line and the second-second wiring line to the first wiring line;
a plurality of second connection wiring lines connecting the second-first wiring line to the second-second wiring line in the extension area; and
a third connection wiring line connecting the plurality of second connection wiring lines to each other in the extension area.

2. The display device of claim 1, wherein the second-first wiring line, the second-second wiring line, and the plurality of second connection wiring lines are integrally formed as one body.

3. The display device of claim 1, further comprising a fourth connection wiring line connecting an end of the second-first wiring line in a direction toward the first wiring line to an end of the second-second wiring line in the direction toward the first wiring line,
wherein the first-first connection wiring line is connected to the fourth connection wiring line.

4. The display device of claim 3, wherein the second-first wiring line, the second-second wiring line, the plurality of second connection wiring lines, and the fourth connection wiring line are integrally formed as one body.

5. The display device of claim 1, wherein the first wiring line is disposed on a first insulating layer, which covers the second-first wiring line, the second-second wiring line, and the plurality of second connection wiring lines.

6. The display device of claim 5, wherein the third connection wiring line is disposed on the first insulating layer.

7. The display device of claim 5, wherein the first-first connection wiring line is disposed on a second insulating layer covering the first wiring line.

8. The display device of claim 1, wherein the plurality of second connection wiring lines extends in a direction crossing the extension direction of the extension area.

9. The display device of claim 1, wherein the third connection wiring line extends in the extension direction of the extension area.

10. The display device of claim 1, further comprising a pixel circuit disposed in the extension area and including a driving transistor,
wherein the first wiring line is configured to transmit a driving voltage to be applied to the driving transistor.

11. The display device of claim 1, wherein the substrate further includes:
a first area adjacent to the central area in a first direction; and
a second area adjacent to the central area in a second direction crossing the first direction,
wherein the intermediate area and the corner area surround at least a part of the first area, the central area, and the second area.

12. The display device of claim 11, wherein the substrate is bent in the corner area, the first area, and the second area.

13. The display device of claim 1, wherein the extension area is provided in plurality, and a separation area is defined between the extension areas adjacent to each other.

14. The display device of claim 1, wherein the substrate is bent in the corner area.

15. A display device comprising:
a substrate including a central area, a corner area including an extension area extending in a direction away from the central area, and an intermediate area between the central area and the corner area, wherein the direction away from the central area is an extension direction of the extension area;
a first wiring line disposed in the intermediate area;
a plurality of second wiring lines disposed in the intermediate area so as to be located between the first wiring line and the extension area, the plurality of second wiring lines being connected to the first wiring line and extending from the first wiring line in an extension direction of the extension area, and the extension direction of the extension area being the same as the direction away from the central area; and
a plurality of additional wiring lines connecting the plurality of second wiring lines to each other.

16. The display device of claim 15, wherein the first wiring line is disposed on a first insulating layer covering the plurality of second wiring lines.

17. The display device of claim 16, wherein the plurality of additional wiring lines is disposed on the first insulating layer.

18. The display device of claim 15, wherein the plurality of additional wiring lines extends in a direction crossing the extension direction.

19. The display device of claim 15, further comprising a pixel circuit disposed in the intermediate area so as to be between the first wiring line and the extension area and including a driving transistor,
wherein the first wiring line is configured to transmit a driving voltage to be applied to the driving transistor.

20. The display device of claim 19, further comprising a display element disposed in the intermediate area and located farther from the first wiring line than the pixel circuit, the display element being electrically connected to the pixel circuit.

21. The display device of claim 15, wherein the substrate further includes:
a first area adjacent to the central area in a first direction; and
a second area adjacent to the central area in a second direction crossing the first direction,
wherein the intermediate area and the corner area surround at least a part of the first area, the central area, and the second area.

22. The display device of claim 21, wherein the substrate is bent in the corner area, the first area, and the second area.

23. The display device of claim 21, wherein the first wiring line extends along an outside of the first area,
wherein the first wiring line in the intermediate area has a width-varying portion outside the first area.

24. The display device of claim 23, wherein an edge of the first wiring line in the direction away from the central area has a stepped portion forming the width-varying portion.

25. The display device of claim 15, wherein the extension area is provided in plurality, and a separation area is defined between the extension areas adjacent to each other.

26. The display device of claim 15, wherein the substrate is bent in the corner area.

* * * * *